US012733150B2

(12) United States Patent
Kim et al.

(10) Patent No.: US 12,733,150 B2
(45) Date of Patent: Sep. 8, 2026

(54) SEMICONDUCTOR DEVICE INCLUDING GATE STRUCTURE

(71) Applicant: SAMSUNG ELECTRONICS CO., LTD., Suwon-si (KR)

(72) Inventors: Sinyeon Kim, Suwon-si (KR); Jooseong Yun, Suwon-si (KR); Jieun Lee, Suwon-si (KR); Hana Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 274 days.

(21) Appl. No.: 18/435,680

(22) Filed: Feb. 7, 2024

(65) Prior Publication Data

US 2024/0276707 A1 Aug. 15, 2024

(30) Foreign Application Priority Data

Feb. 9, 2023 (KR) ........................ 10-2023-0017603

(51) Int. Cl.
*H10B 12/00* (2023.01)
*H10D 62/10* (2025.01)
*H10D 64/27* (2025.01)

(52) U.S. Cl.
CPC ........... *H10B 12/34* (2023.02); *H10D 62/115* (2025.01); *H10D 64/513* (2025.01)

(58) Field of Classification Search
None
See application file for complete search history.

(56) References Cited

U.S. PATENT DOCUMENTS 7,462,544 B2 12/2008 Kim et al.
7,923,773 B2 4/2011 Kujirai
(Continued)

FOREIGN PATENT DOCUMENTS

KR 10-2007-0002735 1/2007
KR 10-2007-0003138 1/2007
(Continued)

OTHER PUBLICATIONS

Office Action dated Jul. 20, 2026 issued in corresponding to Korean Patent Application No. 10-2023-0017603.

*Primary Examiner* — Alexander G Ghyka
(74) *Attorney, Agent, or Firm* — Morgan, Lewis & Bockius LLP

(57) ABSTRACT

A semiconductor device includes an active region, an isolation region on a side surface of the active region, a gate trench having a first trench portion crossing the active region and a second trench portion in the isolation region, a first gate portion within the first trench portion and a second gate portion within the second trench portion. The first gate portion and the second gate portion each includes a gate dielectric layer, a gate electrode on the gate dielectric layer, partially filling the gate trench, and having an upper surface disposed on a level lower than an upper end of the active region, and an insulative capping pattern on the gate electrode. The first gate portion includes a lower region, an intermediate region on the lower region, and an upper region on the intermediate region. A maximum width of the intermediate region is greater than a maximum width of the lower region and greater than a maximum width of the upper region.

20 Claims, 14 Drawing Sheets

(56) References Cited

U.S. PATENT DOCUMENTS

| | | | | |
|---|---|---|---|---|
| 8,119,486 | B2 * | 2/2012 | Kim | H10D 30/0275 257/E21.585 |
| 8,288,231 | B1 * | 10/2012 | Liao | H10D 30/0275 438/270 |
| 8,610,191 | B2 | 12/2013 | Moon et al. | |
| 9,136,270 | B2 | 9/2015 | Kim et al. | |
| 11,239,118 | B2 | 2/2022 | Kim et al. | |
| 2011/0169066 | A1 * | 7/2011 | Moon | H10B 12/053 257/306 |
| 2014/0291755 | A1 * | 10/2014 | Baek | H10B 12/0335 257/334 |
| 2022/0223601 | A1 * | 7/2022 | Lin | H10B 12/34 |
| 2022/0262803 | A1 * | 8/2022 | Jang | H10B 12/34 |
| 2023/0231009 | A1 * | 7/2023 | Kim | H10D 62/111 257/77 |
| 2024/0096987 | A1 * | 3/2024 | Imam | H10D 64/513 |

FOREIGN PATENT DOCUMENTS

| | | | |
|---|---|---|---|
| KR | 10-0707803 | B1 | 4/2007 |
| KR | 10-2011-0078066 | | 7/2011 |
| KR | 10-1075525 | | 10/2011 |
| KR | 10-2012-0066789 | | 6/2012 |
| KR | 10-2020-0061871 | A | 6/2020 |

* cited by examiner

SEMICONDUCTOR DEVICE INCLUDING GATE STRUCTURE

CROSS-REFERENCE TO RELATED APPLICATION(S)

This application claims the benefit under 35 USC 119(a) of Korean Patent Application No. 10-2023-0017603 filed on Feb. 9, 2023 in the Korean Intellectual Property Office, the entire disclosure of which is incorporated herein by reference for all purposes.

BACKGROUND

The present inventive concept relates to a semiconductor device including a gate structure and a method of manufacturing the same.

Research is being conducted to reduce the size of elements constituting semiconductor devices and to improve performance thereof. For example, research is being conducted to reliably and stably form reduced-size elements in DRAMs.

SUMMARY

Example embodiments provide a semiconductor device in which resistance characteristics of a gate electrode may be improved.

Example embodiments provide a semiconductor device having improved performance.

Example embodiments provide a method of forming the semiconductor device.

A semiconductor device according to example embodiments is provided. The semiconductor device includes a semiconductor substrate; an active region on the semiconductor substrate; an isolation region on a side surface of the active region; a gate trench having a first trench portion crossing the active region and a second trench portion in the isolation region; a first gate portion within the first trench portion and a second gate portion within the second trench portion. The active region extends in a first direction. The first gate portion includes a first gate dielectric layer on an inner wall of the first trench portion; a first gate electrode on the first gate dielectric layer, partially filling the first trench portion, and having an upper surface disposed on a level lower than an upper end of the active region; and a first insulative capping pattern on the first gate electrode. The first gate portion includes a first lower region, a first intermediate region on the first lower region, and a first upper region on the first intermediate region, and in the first direction, a maximum width of the first intermediate region is greater than a maximum width of the first lower region and greater than a maximum width of the first upper region.

A semiconductor device according to example embodiments is provided. The semiconductor device includes a semiconductor substrate; an active region on the semiconductor substrate; an isolation region on the semiconductor substrate and on a side surface of the active region; a first trench portion crossing the active region and a second trench portion in the isolation region; a first gate portion within the first trench portion and a second gate portion within the second trench portion. The first gate portion includes a first gate dielectric layer on an inner wall of the first trench portion; a first gate electrode on the first gate dielectric layer and partially filling the first trench portion; and a first insulative capping pattern on the first gate electrode. The active region extends in a first direction. The first gate portion has a bottom surface curved downwardly, and a first side surface and a second side surface extending from the bottom surface and opposing each other, the first side surface includes a first lower portion, and a first upper portion on the first lower portion and having a slope different from a slope of the first lower portion, and the second side surface includes a second lower portion, and a second upper portion on the second lower portion and having a slope different from a slope of the second lower portion.

A semiconductor device according to example embodiments is provided. The semiconductor device includes a semiconductor substrate; an active region on the semiconductor substrate; an isolation region on the semiconductor substrate and on a side surface of the active region; and a first gate structure and a second gate structure extending into the isolation region and crossing the active region. Each of the first and second gate structures includes a gate electrode and an insulating capping pattern stacked sequentially; and a gate dielectric layer covering a lower surface of the gate electrode, a side surface of the gate electrode, and a side surface of the insulating capping pattern. The active region extends in a first direction, an upper surface of the gate electrode is disposed on a level lower than an upper end of the active region, a lower end of the second gate portion is disposed on a level lower than a lower end of the first gate portion, each of the first and second gate structures has a first gate portion crossing the active region and a second gate portion extending from the first gate portion and disposed in the isolation region, in each of the first and second gate structures, the first gate portion has a bottom surface curved downwardly, and a first side surface and a second side surface extending from the bottom surface and opposing each other, at least one of the first side surface and the second side surface includes a lower portion and an upper portion having different slopes, and in the first gate portion, a maximum width of the gate electrode in the first direction is greater than a maximum width of the insulating capping pattern in the first direction.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, terms such as "upper", "middle" and "lower" may be replaced with other terms, such as "first", "second" and "third" to describe the elements of the specification. Terms such as "first", "second" and "third" may be used to describe various elements, but the elements are not limited by the terms, and a "first element" may be referred to as a "second element".

Figure 1:
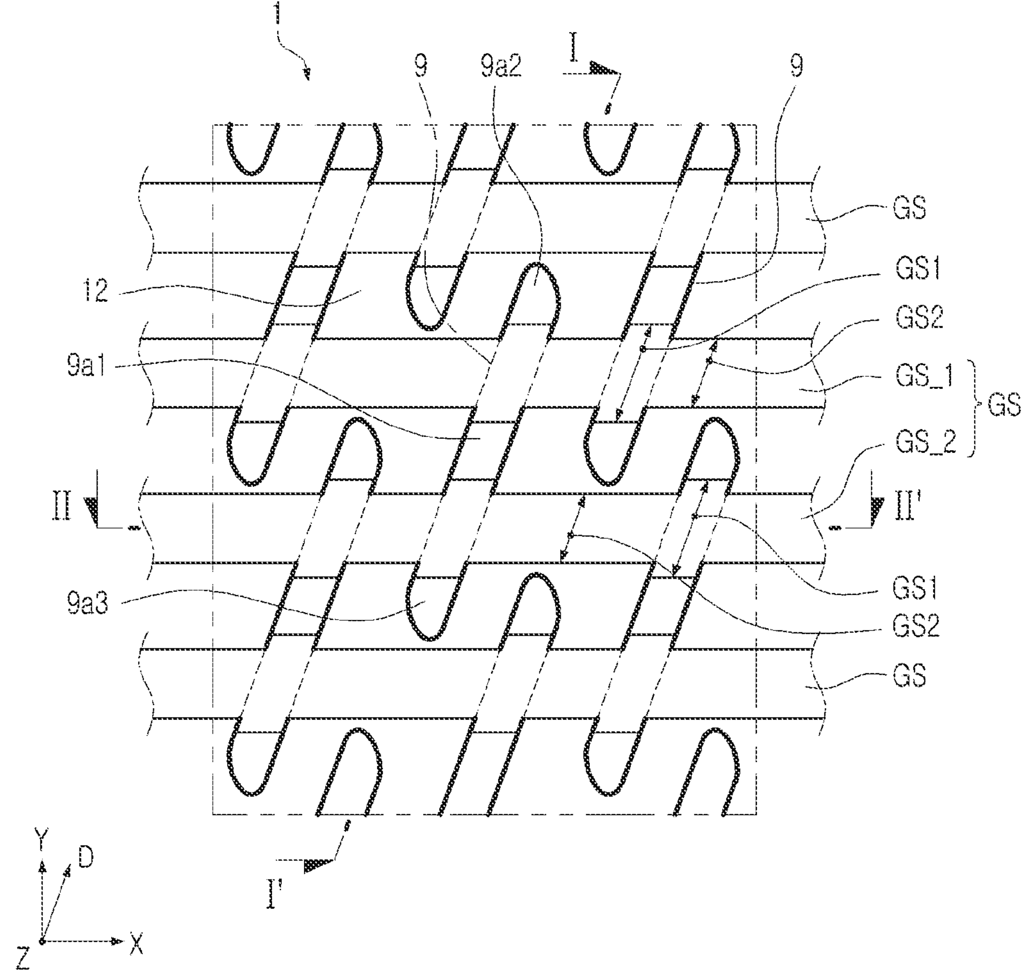
FIGS. 1, 2A, 2B, 3A and 3B are diagrams conceptually illustrating illustrative examples of a semiconductor device according to an example embodiment.
Figure 2A:
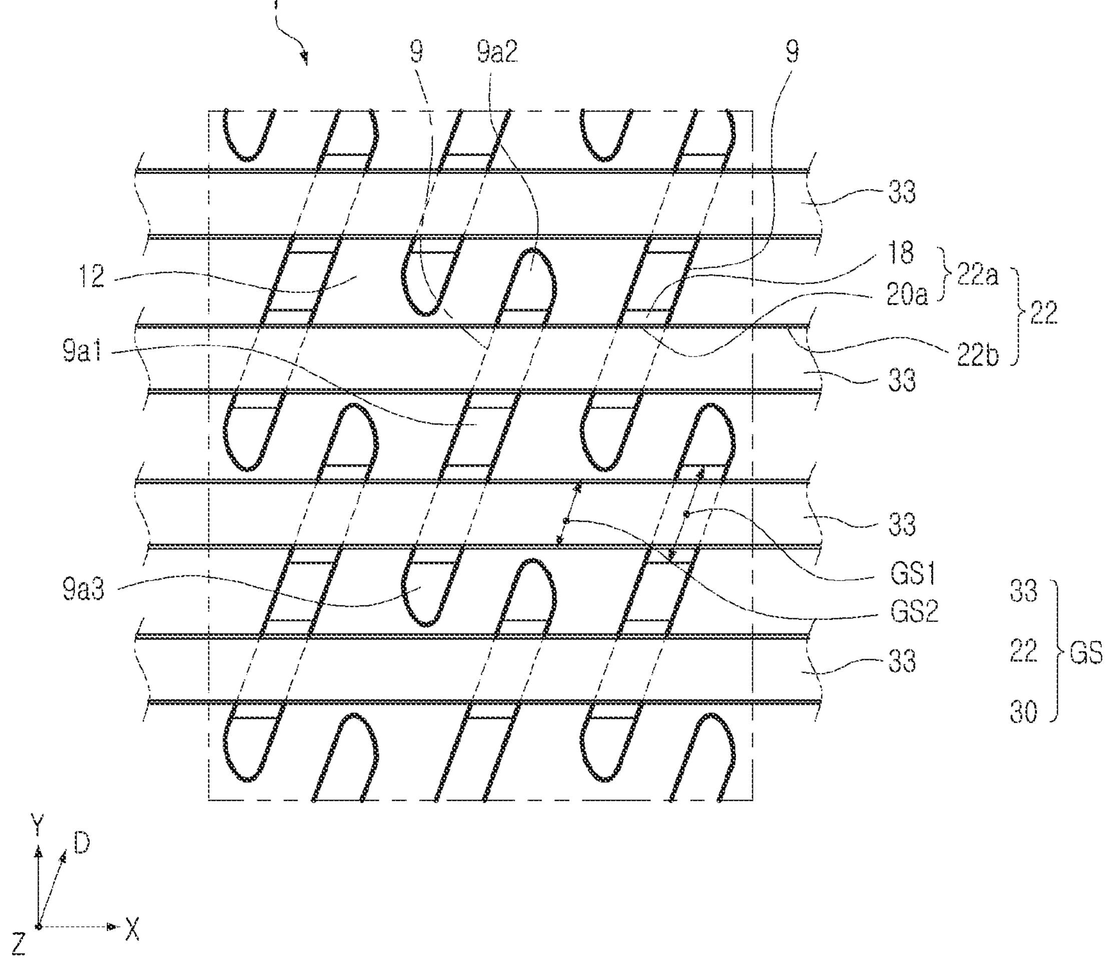
Figure 2B:
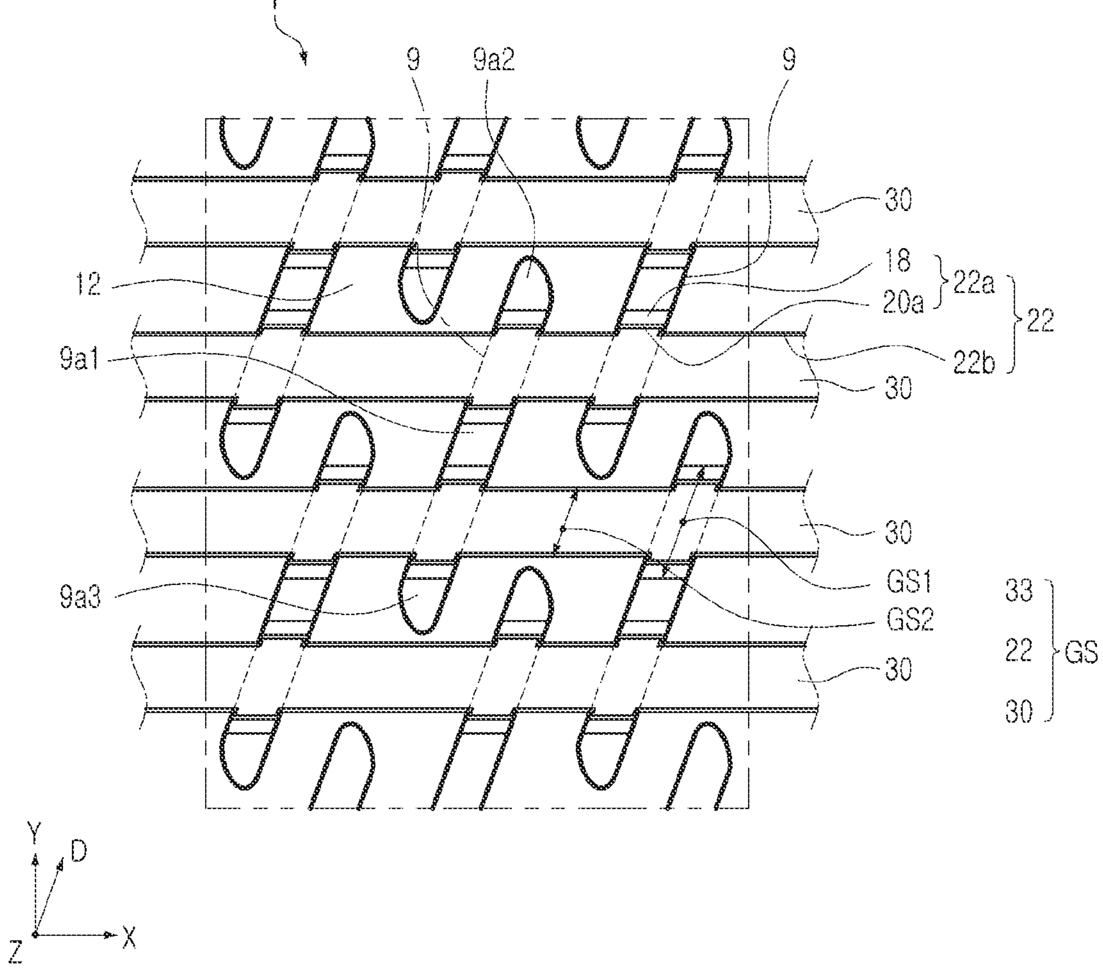
Figure 3A:
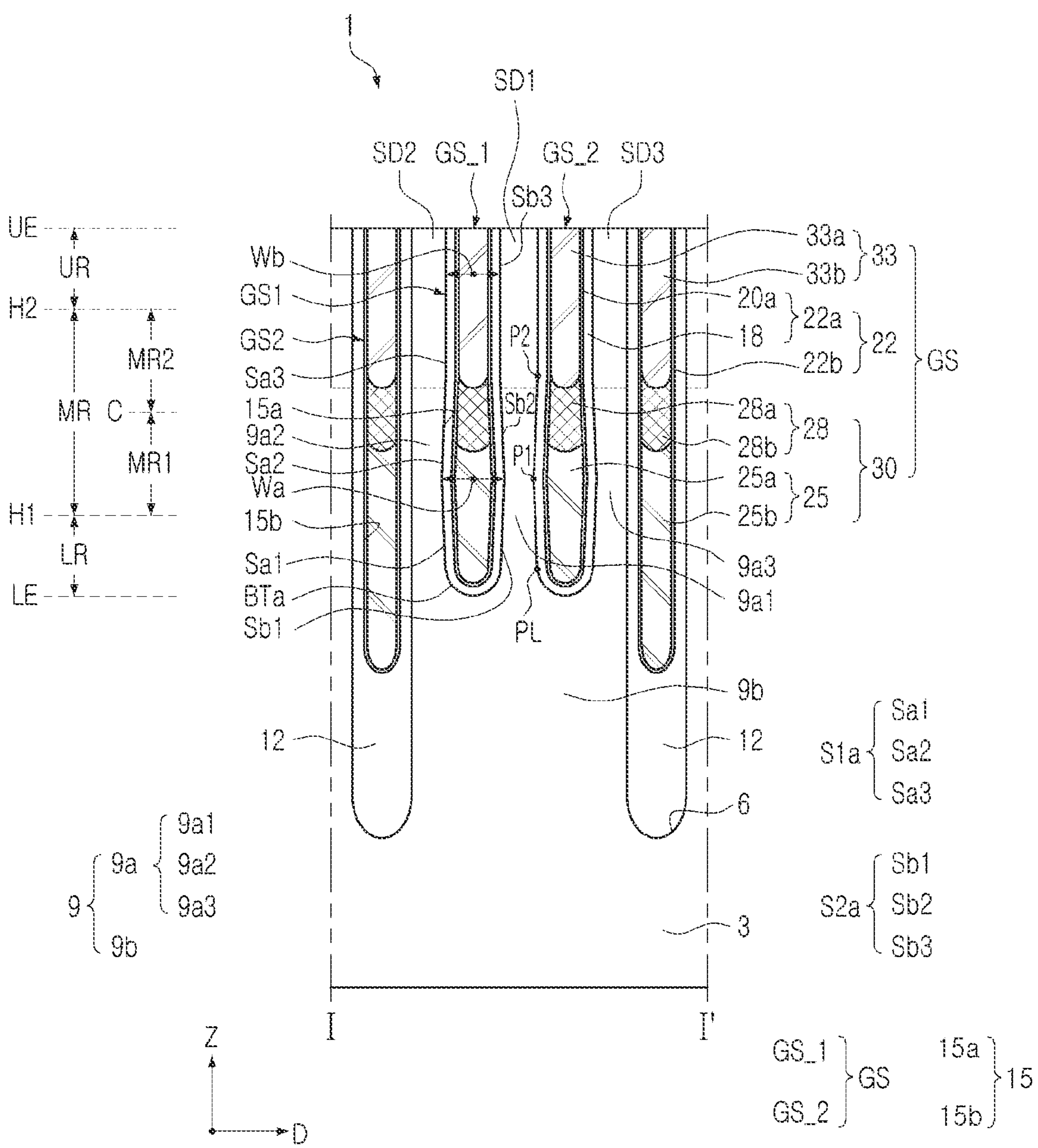
Figure 3B:
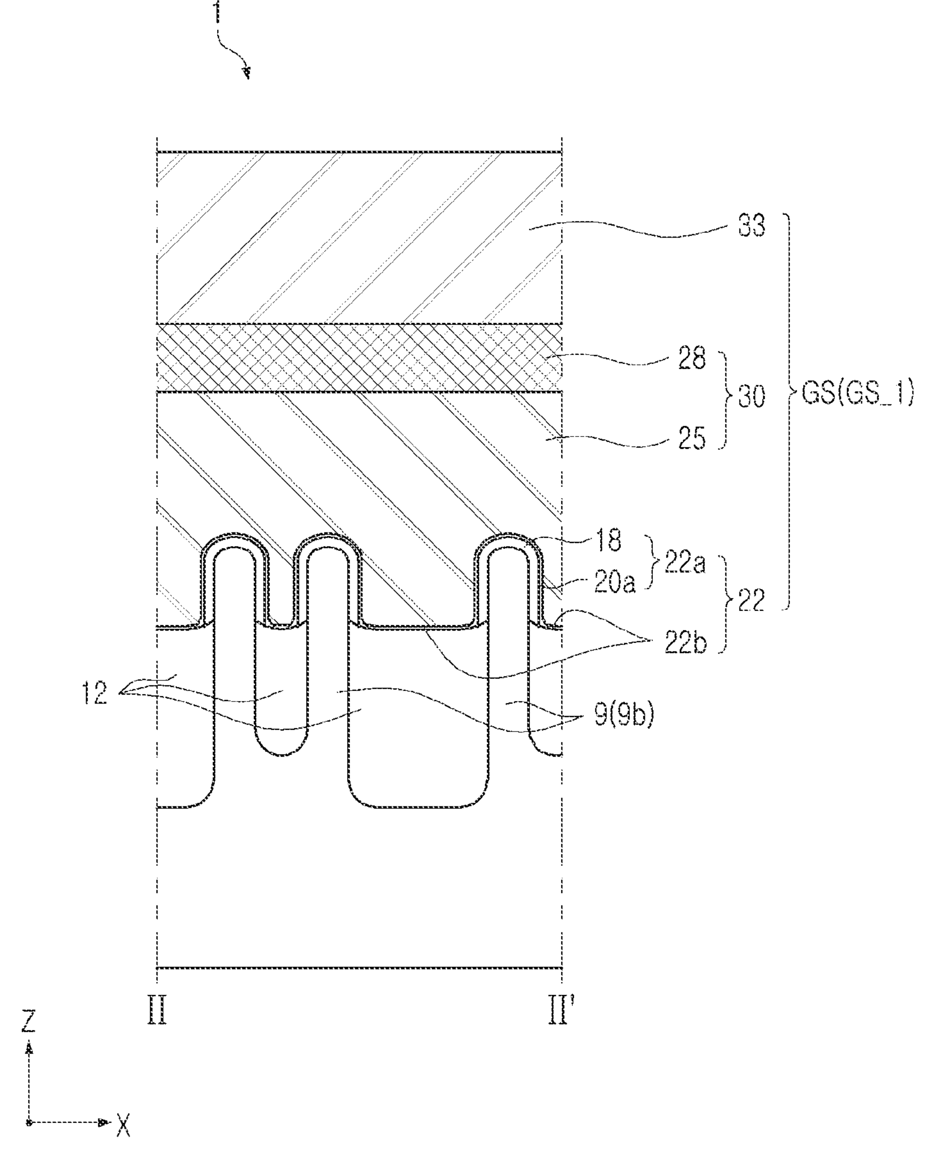

First, a semiconductor device according to an example embodiment will be described with reference to FIGS. 1, 2A, 2B, 3A, and 3B. In FIGS. 1, 2A, 2B, 3A, and 3B, FIG. 1 is a plan view conceptually illustrating a semiconductor device according to an example embodiment, FIG. 2A is a plan view conceptually illustrating a portion of an upper region of a gate structure of a semiconductor device according to an example embodiment in FIG. 1, and FIG. 2B is a plan view conceptually illustrating a portion of an intermediate region of a gate structure of a semiconductor device according to an example embodiment in FIG. 1. FIG. 3A is a cross-sectional view conceptually illustrating a region taken along line I-I' of FIG. 1, and FIG. 3B is a cross-sectional view conceptually illustrating a region taken along line II-II' in FIG. 1.

Referring to FIGS. 1, 2A, 2B, 3A, and 3B, a semiconductor device 1 according to an example embodiment may include a semiconductor substrate 3, active regions 9 on the semiconductor substrate 3, an isolation region 12 disposed on side surfaces of the active regions 9 on the semiconductor substrate 3, gate trenches 15 crossing the active regions 9 and extending into the isolation regions 12, and gate structures GS in the gate trenches 15.

The semiconductor substrate 3 may be provided as a bulk wafer, an epitaxial layer, a Silicon-On-Insulator (SOI) layer, or a Semiconductor-On-Insulator (SeOI) layer. The semiconductor substrate 3 may include a Group IV semiconductor, a Group III-V compound semiconductor, or a Group II-VI compound semiconductor. For example, the semiconductor substrate 3 may be a substrate including at least one of silicon, silicon carbide, germanium, or silicon-germanium. For example, the semiconductor substrate 3 may be a single crystal silicon substrate containing a silicon material, for example, a single crystal silicon material.

Each of the active regions 9 may protrude from the semiconductor substrate 3 in a vertical direction Z. The active regions 9 may be formed of substantially the same semiconductor material as a region of the semiconductor substrate 3 adjacent to the active regions 9, for example, single crystal silicon. Accordingly, the active region 9 may be referred to as a semiconductor region or a single crystal silicon region. In a plan view, each of the active regions 9 may have a bar shape extending in the first direction D, see, for example, FIGS. 1, 2A and 2B.

The isolation region 12 may be a shallow trench isolation (STI) that defines the active regions 9. The isolation region 12 may be formed of an electrically insulating material, including at least one of silicon oxide or silicon nitride. The height of the bottom surface of the isolation region 12 may vary depending on the adjacent distance between the active regions 9. For example, as illustrated in FIG. 3B, among the active regions 9, the bottom surface of the isolation region 12 positioned between relatively closely spaced adjacent active regions 9 may be disposed on a level higher than the bottom surface of the isolation region 12 located between relatively farther apart adjacent active region 9.

Each of the gate trenches 15 may have a first trench portion 15(15*a*) crossing the active region 9, and a second trench portion 15*b* extending from the first trench portion 15*a* into the isolation region 12. In each of the gate trenches 15, a bottom surface of the second trench portion 15*b* may be disposed on a level lower than a bottom surface of the first trench portion 15*a*. In each of the gate trenches 15, in the cross-sectional structure illustrated in FIG. 3B, by the height difference between the bottom surface of the first trench portion 15*a* and the bottom surface of the second trench portion 15*b*, the active region 9 may have a fin shape protruding from the isolation region 12.

Each of the gate structures GS may have a first gate portion GS1 in the first trench portion 15*a* and a second gate portion GS2 in the second trench portion 15*b*. In plan view, each of the gate structures GS may have a line shape extending in the second direction X. The first direction D may cross the second direction X in an oblique direction. Accordingly, the active regions 9 may cross the gate structures GS in an oblique direction. In the first direction D, the width of the first gate portion GS1 may be greater than the width of the second gate portion GS2.

Hereinafter, one active region among the active regions 9 will be mainly described.

Referring to FIG. 3A, the gate structures GS may include a first gate structure GS_1 and a second gate structure GS_2 adjacent to each other, where the first gate structure GS_1 and second gate structure GS_2 can be separated by a first impurity region SD1. The first and second gate structures GS_1 and GS_2 may each fill a gate trench 15 extending into an isolation region 12, while crossing an active region 9. Accordingly, each of the first and second gate structures GS_1 and GS_2 may cross the active region 9 and extend into the isolation region 12.

One active region 9 may include a base active portion 9*b*, a first active portion 9*a*1, a second active portion 9*a*2, and a third active portion 9*a*3. The first active portion 9*a*1 can be separated from the second active portion 9*a*2 by the first gate structure GS_1, and the first active portion 9*a*1 can be separated from the third active portion 9*a*3 by the second gate structure GS_2. The first active portion 9*a*1, the second active portion 9*a*2, and the third active portion 9*a*3 may have a form protruding from the base active portion 9*b* in the vertical direction (a Z direction). The first gate structure GS_1 and the second gate structure GS_2 can extend into the active region 9.

The semiconductor device 1 may further include a first impurity region SD1 in the first active portion 9*a*1, a second impurity region SD2 in the second active portion 9*a*2, and a third impurity region SD3 in the third active portion 9*a*3. The first impurity region SD1 may be formed in an upper portion of the first active portion 9*a*1. The second impurity region SD2 may be formed in an upper portion of the second active portion 9*a*2. The third impurity region SD3 may be formed in an upper portion of the third active portion 9*a*3.

Each of the gate structures GS may include a dielectric layer 22, a gate electrode 30 and an insulating capping pattern 33. In each of the gate structures GS, the dielectric layer 22 may be disposed on an inner wall of the gate trench 15, and the gate electrode 30 may be disposed in the gate trench 15 on the dielectric layer 22. A height of the gate trench 15 may be partially filled, and the insulating capping pattern 33 may fill the remaining upper portion of the gate trench 15 on the gate electrode 30. The gate electrode 30 and the insulating capping pattern 33 may be stacked sequentially within the gate trench 15. The dielectric layer 22 may cover a lower surface of the gate electrode 30, side surfaces of the gate electrode 30, and side surfaces of the insulating capping pattern 33. An upper surface of the gate electrode 30 may be disposed on a level lower than an upper surface of the active region 9. An upper surface of the insulating capping pattern 33 may be coplanar with an upper surface of the active region 9.

In various embodiments, at least a portion of the first impurity region SD1 may be disposed on the same level as the insulating capping pattern 33. At least a portion of the first impurity region SD1 may be lower than the insulating capping pattern 33. At least a portion of the second impurity region SD2 may be disposed at the same level as the insulating capping pattern 33. At least a portion of the second impurity region SD2 may be lower than the insulating capping pattern 33. At least a portion of the third impurity region SD3 may be disposed on the same level as the insulating capping pattern 33. At least a portion of the third impurity region SD3 may be lower than the insulating capping pattern 33. The first impurity region SD1 may be a first source/drain region, and the second and third impurity regions SD2 and SD3 may be second source/drain regions. The first to third impurity regions SD1, SD2, and SD3 may have an N-type conductivity, and a portion of the active region 9 positioned under the first to third impurity regions SD1, SD2, and SD3 may have a P-type conductivity.

The dielectric layer 22 may be disposed between the bottom surface of the gate electrode 30 and the bottom surface of the gate trench 15, between the side surface of the gate electrode 30 and the side wall of the gate trench 15, and between the side surface of the insulating capping pattern 33 and the sidewall of the gate trench 15.

The dielectric layer 22 may be a gate dielectric layer. The dielectric layer 22 may include at least one layer. The dielectric layer 22 may include at least one of silicon oxide or a high-κ dielectric. The high-κ dielectric may be a dielectric material having a dielectric constant higher than the dielectric constant of silicon oxide. The high-κ dielectric may include a metal oxide or a metal oxynitride. For example, the high dielectric may be $HfO_2$, HfSiO, HfSiON, HfTaO, HfTiO, HfZrO, $ZrO_2$, $Al_2O_3$, or combinations thereof, but is not limited thereto.

The dielectric layer 22 may include a first dielectric portion 22*a* within the first gate portion GS1 and a second dielectric portion 22*b* within the second gate portion GS2. The first dielectric portion 22*a* may include a first dielectric layer 18 covering the active region 9 exposed by the gate trench 15 and a second dielectric layer 20*a* covering the first dielectric layer 18. A thickness of the first dielectric layer 18 may be greater than a thickness of the second dielectric layer 20*a*. The second dielectric portion 22*b* may be a dielectric layer extending to the second dielectric layer 20*a*. The second dielectric portion 22*b* and the second dielectric layer 20*a* may be integrally formed. The second dielectric portion 22*b* and the second dielectric layer 20*a* may be formed of the same material and may have the same thickness. The first dielectric layer 18 may include an oxide formed by thermally oxidizing the active region 9 using a thermal oxidation process, and the second dielectric layer 20*a* and the second dielectric portion 22*b* may include a deposited oxide formed by an atomic layer deposition process (ALD). The second dielectric layer 20*a* and the second dielectric portion 22*b* may include at least one of silicon oxide or a high-κ dielectric.

In an example embodiment, the gate structures GS and the first to third impurity regions SD1, SD2, and SD3 together with the gate electrode 30, the dielectric layer 22, and the first to third impurity regions SD1, SD2, and SD3, as well as portions of the active region 9 below the impurity regions SD1, SD2, and SD3 may constitute transistors.

The gate electrode 30 may include at least one conductive material. For example, the gate electrode 30 may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, graphene, carbon nanotube, or combinations thereof, but is not limited thereto.

In various embodiments, the gate electrode 30 may include a single layer or multiple layers of the above materials. For example, the gate electrode 30 may include a first conductive pattern 25 and a second conductive pattern 28 on the first conductive pattern 25. The first conductive pattern 25 may include a first conductive portion 25*a* within the first gate portion GS1 and a second conductive portion 25*b* within the second gate portion GS2.

In an example, an upper surface of the first conductive pattern 25 may have a downward curved shape (concave).

In another example, the upper surface of the first conductive pattern 25 may be flat.

In another example, an upper surface of the first conductive pattern 25 may have an upward curved shape (convex).

In an example, an upper surface of the second conductive pattern 28 may have a downward curved shape.

In another example, the upper surface of the second conductive pattern 28 may be flat.

In another example, an upper surface of the second conductive pattern 28 may have an upward curved shape (convex).

In various embodiments, a material of the first conductive pattern 25 may be different from that of the second conductive pattern 28. In an example, the first conductive pattern 25 may include a work function control material, such as at least one of a metal and/or a metal nitride, such as TiN, and the second conductive pattern 28 may include a material capable of preventing or significantly reducing gate induced drain leakage (GIDL) of the transistor, for example, doped silicon. As such, the first conductive pattern 25 may serve to control the threshold voltage of the transistor, and the second conductive pattern 28 may serve to prevent or significantly reduce GIDL of the transistor.

In an example, in the first conductive pattern 25, an upper surface of the first conductive portion 25*a* and an upper surface of the second conductive portion 25*b* may be positioned at substantially the same level.

In another example, in the first conductive pattern 25, a height difference between the upper surface of the first conductive portion 25*a* and the upper surface of the second conductive portion 25*b* may be smaller than the width of the first gate portion GS1.

The second conductive pattern 28 may include a first conductive portion 28*a* within the first gate portion GS1 and a second conductive portion 28*b* within the second gate portion GS2.

In an example, in the second conductive pattern 28, an upper surface of the first conductive portion 28*a* and an upper surface of the second conductive portion 28*b* may be positioned at substantially the same level.

In another example, in the second conductive pattern 28, a height level difference between the upper surface of the first conductive portion 28*a* and the upper surface of the second conductive portion 28*b* may be smaller than the width of the first gate portion GS1.

The insulating capping pattern 33 may include an insulating material such as silicon nitride. An upper surface of the insulating capping pattern 33 may be disposed at substantially the same level as an upper surface of the active region 9. An upper surface of the second conductive pattern 28 and a lower surface of the insulating capping pattern 33 may contact each other, where for example, a first insulating capping pattern 33*a* can be on the first conductive portion 28*a*, and the second insulating capping pattern 33*b* can be on the second conductive portion 28*b*. An upper surface of the first conductive pattern 25 and a lower surface of the second conductive pattern 28 may contact each other, where for example, the first conductive portion 28*a* can be on the first conductive portion 25*a*, and the second conductive portion 28*b* can be on the second conductive portion 25*b*.

The first gate portion GS1 may include a lower region LR, an intermediate (or middle) region MR on the lower region LR, and an upper region UR on the intermediate region MR.

In the first gate portion GS1, the lower region LR may be an area between the lower end LE of the first gate portion GS1 and the first height H1, the intermediate region MR may be an area between the first height H1 and the second height H2, and the upper region UR may be an area from the second height H2 to the upper end UE of the first gate portion GS1.

The intermediate (or middle) region MR may include a first intermediate region MR1 and a second intermediate region MR2 on the first intermediate region MR1. The first intermediate region MR1 may be a region between the first height H1 and the middle portion C, and the second intermediate region MR2 may be a region between the middle portion C and the second height H2. In this case, the middle portion C may be the middle (or halfway point) between the lower end LE and the upper end UE of the first gate portion GS1.

In the example embodiment, when the lower end LE of the first gate portion GS1 is taken as a reference and the height from the lower end LE to the upper end UE is regarded as 100, the first height H1 is about 20, the middle portion C may be about 50, and the second height H2 may be about 80.

In the first direction D, the first gate portion GS1 may have a maximum width Wa in the intermediate region MR. For example, in the cross-sectional structure as illustrated in FIG. 3A cut in the first direction D, and in the first gate portion GS1, a maximum width Wa of the intermediate region MR may be greater than the maximum width of the lower region LR, and may be greater than a maximum width Wb of the upper region UR. The lower region LR may have a tapered shape increasing towards the intermediate region MR, such that the maximum width of the lower region LR may be at the first height H1 forming a boundary with the intermediate region MR.

In the first direction D, the gate electrode 30, including the second conductive pattern 28 and the first conductive pattern 25, may have a maximum width in a region in which the first gate portion GS1 has the maximum width Wa, where the first conductive portion 25*a* may have the maximum width Wa. The first insulating capping pattern 33*a* may have the width Wb. The width of the first insulating capping pattern 33*a* may be different from a width of the second insulating capping pattern 33*b* in the first direction D. For example, the width of the first insulating capping pattern 33*a* may be less than the width of the second insulating capping pattern 33*b* in the first direction D.

In the first direction D, in a region where the first gate portion GS1 has the maximum width Wa, the structure including the gate electrode 30 may have the maximum width.

An upper surface of the gate electrode 30 may be disposed in the intermediate region MR. For example, an upper surface of the gate electrode 30 may be disposed in the intermediate region MR adjacent to the middle portion C.

In an example, an upper surface of the gate electrode 30 may be disposed at substantially the same level as the middle portion C.

In another example, an upper surface of the gate electrode 30 may be disposed in the first intermediate region MR1 adjacent to the middle portion C.

In another example, an upper surface of the gate electrode 30 may be disposed in the second intermediate region MR2 adjacent to the middle portion C.

An upper surface of the gate electrode 30 may be an upper surface of the second conductive pattern 28. The upper surface of the first conductive portion 28*a* can be in the second intermediate region MR2.

An upper surface of the first conductive pattern 25 may be disposed in the first intermediate region MR1.

In the first gate portion GS1, the thickness of the first conductive portion 25*a* of the first conductive pattern 25 in the vertical direction Z may be greater than the thickness of the first conductive portion 28*a* of the second conductive pattern 28 in the vertical direction (Z). In this case, the thickness in the vertical direction (Z) may refer to a distance between the upper surface and the lower surface.

In an example, in the first gate portion GS1, the portion having the maximum width Wa in the intermediate region MR may be a portion where the first conductive pattern 25 is positioned.

The first gate portion GS1 may have a downwardly curved bottom surface BTa, and a first side surface S1*a* and a second side surface S2*a* extending from the bottom surface BTa and opposing each other in the first direction D.

The first side surface (S1*a*) may include a first lower portion (Sa1), a first middle portion Sa2 on the first lower portion Sa1, and a first upper portion Sa3 on the first middle portion Sa2. The second side surface (S2*a*) may include a second lower portion (Sb1), a second middle portion (Sb2) on the second lower portion (Sb1), and a second upper portion Sb3 on the second middle portion Sb2.

In the first and second side surfaces S1*a* and S2*a*, the first lower portion Sa1 and the second lower portion Sb1 may face each other, the first middle portion (Sa2) and the second middle portion (Sb2) may face each other, and the first upper portion Sa3 and the second upper portion Sb3 may face each other. The first side surface S1*a* and the second side surface S2*a* can have an asymmetric structure.

In this case, the vertical direction Z is defined and described as a direction from the lower end LE of the first gate portion GS1 to the upper end UE of the first gate portion GS1.

In the first and second side surfaces S1*a* and S2*a*, the first lower portion Sa1 and the second lower portion Sb1 may be inclined so that the width of the first gate portion GS1 increases in the vertical direction Z, and the first middle portion Sa2 and the second middle portion Sb2 may be inclined so that the width of the first gate portion GS1 decreases in the vertical direction Z, such that the lower region LR is tapered downward and the intermediate region MR is tapered upward. In the first and second side surfaces S1*a* and S2*a*, the first upper portion Sa3 and the second upper portion Sb3 may have a substantially vertical shape.

The first lower portion Sa1 and the first middle portion Sa2 may have different slopes. The second lower portion Sb1 and the second middle portion Sb2 may have different slopes. The first middle portion Sa2 and the first upper portion Sa3 may have different slopes. The second middle portion Sb2 and the second upper portion Sb3 may have different slopes. The second lower portion Sb1 may have a positive slope, and the second middle portion Sb2 may have a negative slope.

A side surface of the first gate portion GS1 may include a lower portion PL, a first portion P1, and a second portion P2. In the first gate portion GS1, the lower portion PL may be a portion between the bottom surface BTa and the first lower portion Sa1 and between the bottom surface BTa and the second lower portion Sb1, and the first portion P1 may be a portion between the first lower portion Sa1 and the first middle portion Sa2 and between the second lower portion Sb1 and the second middle portion Sb2. The second portion P2 may be a portion between the first upper portion Sa3 and the first middle portion Sa2 and between the second upper portion Sb3 and the second middle portion Sb2.

In the first gate portion GS1, the width of the portion where the first portion P1 may be located may be greater than the width of the portion where the lower portion PL is located, and may be greater than the width of the part where the second portion P2 is located.

In the first gate portion GS1, a width at a portion where the first portion P1 is positioned may be the maximum width of the first gate portion GS1.

In the first gate portion GS1, the lower portion PL may be disposed on a level lower than the first height H1.

In the first gate portion GS1, the first portion P1 may be disposed on a level higher than the first height H1.

In the first gate portion GS1, the first portion P1 may be disposed on a level lower than the second height H2.

In the first gate portion GS1, the first portion P1 may be disposed on a level lower than a level of the middle portion C.

In the first gate portion GS1, the second portion P2 may be disposed on a level higher than a level of the middle portion C.

In the first gate portion GS1, the second portion P2 may be disposed on a level lower than the second height H2.

The above-described description of the shape of the gate structure GS may be understood as being replaced by a description of the shape of the structure of the gate electrode 30 and the insulating capping pattern 33 stacked sequentially. For example, in the cross-sectional structure cut in the first direction D as illustrated in FIG. 3A, the cross-sectional shape of the structure including the gate electrode 30 and the insulating capping pattern 33 stacked sequentially in the first gate portion GS1 may be substantially the same as the cross-sectional shape reduced by the thickness of the dielectric layer 22 having a certain thickness in the shape of the first gate portion GS1 of the gate structure GS.

In the example embodiment, at the height level of the first gate portion GS1 having the maximum width Wa, the difference between a first width of the first gate portion GS1 in the first direction D (the portion indicated by GS1 in FIG. 2B) and a second width of the second gate portion GS2 in the first direction D (the portion indicated by GS2 in FIG. 2B) may be greater than the difference between a third width of the first gate portion GS1 in the first direction D (the portion indicated by GS1 in FIG. 2A) and a fourth width of the second gate portion GS2 in the first direction D (the portion indicated by GS2 in FIG. 2A) at the height level where the insulating capping pattern 33 is located. The first width may be a width of the portion indicated by GS1 in FIG. 2B, the second width may be a width of the portion indicated by GS2 in FIG. 2B, the third width may be a width of the portion indicated by GS1 in FIG. 2A, and the fourth width may be a width of the portion indicated by GS2 in FIG. 2A. A height level at which the insulating capping pattern 33 is positioned may be a height level at which an upper region of the insulating capping pattern 33 is positioned.

A height level of the first gate portion GS1 having the maximum width Wa may be a height level at which the gate electrode 30 is positioned. The first width of the first gate portion GS1 in the first direction D (the portion indicated by GS1 in FIG. 2B) may be the maximum width (Wa in FIG. 3A) of the first gate portion GS1.

At the height level of the first gate portion GS1 having the maximum width Wa, the difference between the first width of the gate electrode 30 of the first gate portion GS1 in the first direction D and the second width of the gate electrode 30 of the second gate portion GS2 in the first direction D may be greater than the difference between the third width of the insulating capping pattern 33 of the first gate portion GS1 in the first direction D and the fourth width of the insulating capping pattern 33 of the second gate portion GS2 in the first direction (D) at the height level where the insulating capping pattern 33 is located. A height level at which the insulating capping pattern 33 is positioned may be a height level at which an upper region of the insulating capping pattern 33 is positioned.

At the height level of the first gate portion GS1 having the maximum width Wa, a first width of the gate electrode 30 of the first gate portion GS1 in the first direction D may be different from the second width of the gate electrode 30 of the second gate portion GS2 in the first direction D. At the height level of the first gate portion GS1 having the maximum width Wa, a first width of the gate electrode 30 of the first gate portion GS1 in the first direction D may be larger than the second width of the gate electrode 30 of the second gate portion GS2 in the first direction D. At a height level where the insulating capping pattern 33 is positioned, a third width of the insulating capping pattern 33 of the first gate portion GS1 in the first direction D may be substantially equal to the fourth width of the insulating capping pattern 33 of the second gate portion GS2 in the first direction (D).

In the first gate portion GS1, the maximum width of the gate electrode 30 in the first direction D1 may be greater than the maximum width of the insulating capping pattern 33 in the first direction D1. In the gate electrode 30, a portion of the gate electrode 30 having the maximum width may be disposed on a level higher than the middle between the upper and lower surfaces of the first conductive pattern 25. In the gate electrode 30, a portion of the gate electrode 30 having the maximum width may be disposed on a level lower than an upper surface of the second conductive pattern 28.

Since the first gate portion GS1 may have a maximum width in the intermediate region MR, resistance characteristics of the gate electrode 30 may be improved. Therefore, the electrical characteristics of the semiconductor device 1 may be improved, and the performance of the semiconductor device 1 may be improved.

Hereinafter, with reference to FIGS. 4A, 4B, 5, 6A, 6B, and 7, respectively, various modified examples of the elements of the above-described embodiment will be described. Various modified examples will be described focusing on the modified or replaced elements. The elements described above may be directly cited without separate detailed description, or the description may be omitted. In addition, elements that may be modified or replaced are described below with reference to the following drawings, where elements may be modified, replaced, or combined with each other. A semiconductor device according to the example may be configured.

Figure 4A:
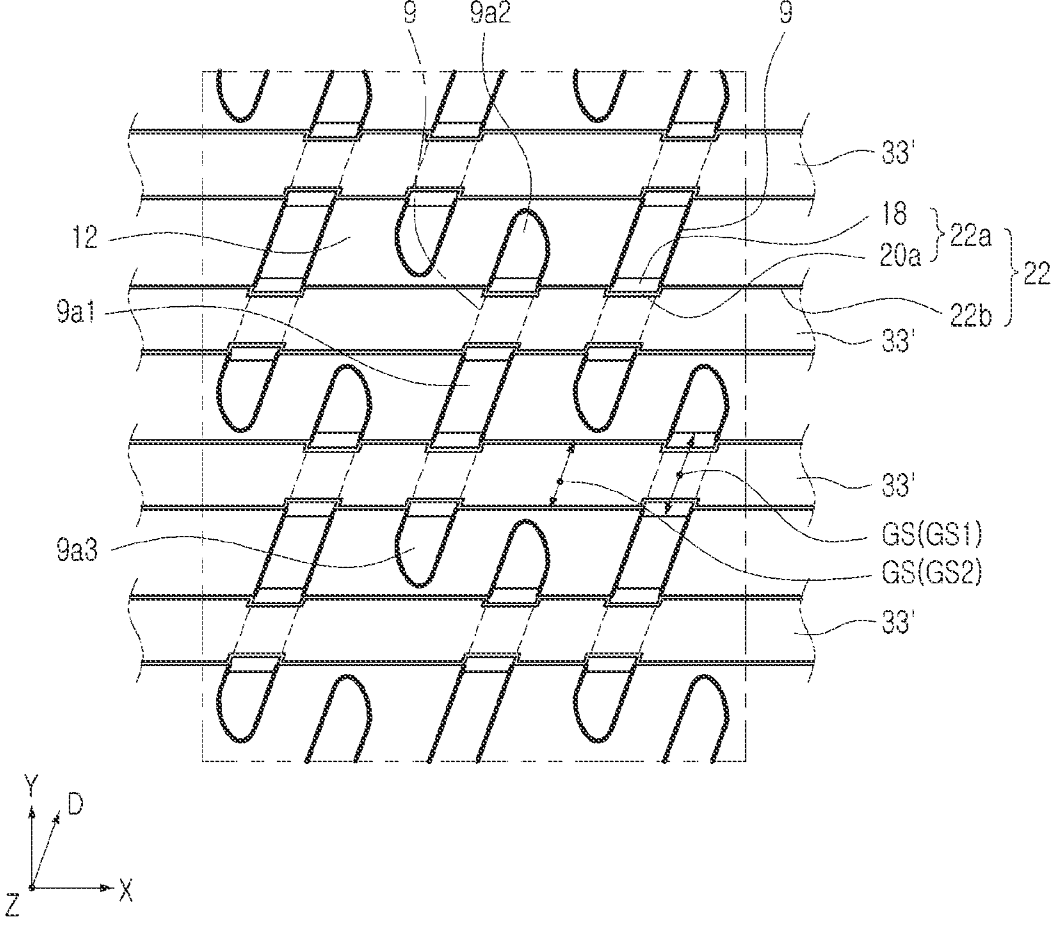
FIG. 4A is a plan view conceptually illustrating a modified example of some elements of a semiconductor device according to an example embodiment.

First, with reference to FIG. 4A, a modified example of the insulating capping pattern 33 described above will be described. FIG. 4A is a plan view schematically illustrating a modified example of the insulating capping pattern 33 from the top view of FIG. 2A.

Referring to FIG. 4A, the insulating capping pattern 33 may be transformed into another insulating capping pattern 33' in which the width of the first gate portion GS1 and the width of the second gate portion GS2 are different from each other. For example, the width of the insulating capping pattern 33' of the first gate portion GS1 in the first direction D may be different from the width of the insulating capping pattern 33' of the second gate portion GS2 in the first direction D. The width of the insulating capping pattern 33' of the first gate portion GS1 in the first direction D may be less than a width of the insulating capping pattern 33' of the second gate portion GS2 in the first direction D. Accordingly, the insulating capping pattern 33' may have a relatively narrower width in the first gate portion GS1 and a relatively wider width in the second gate portion GS2.

Figure 4B:
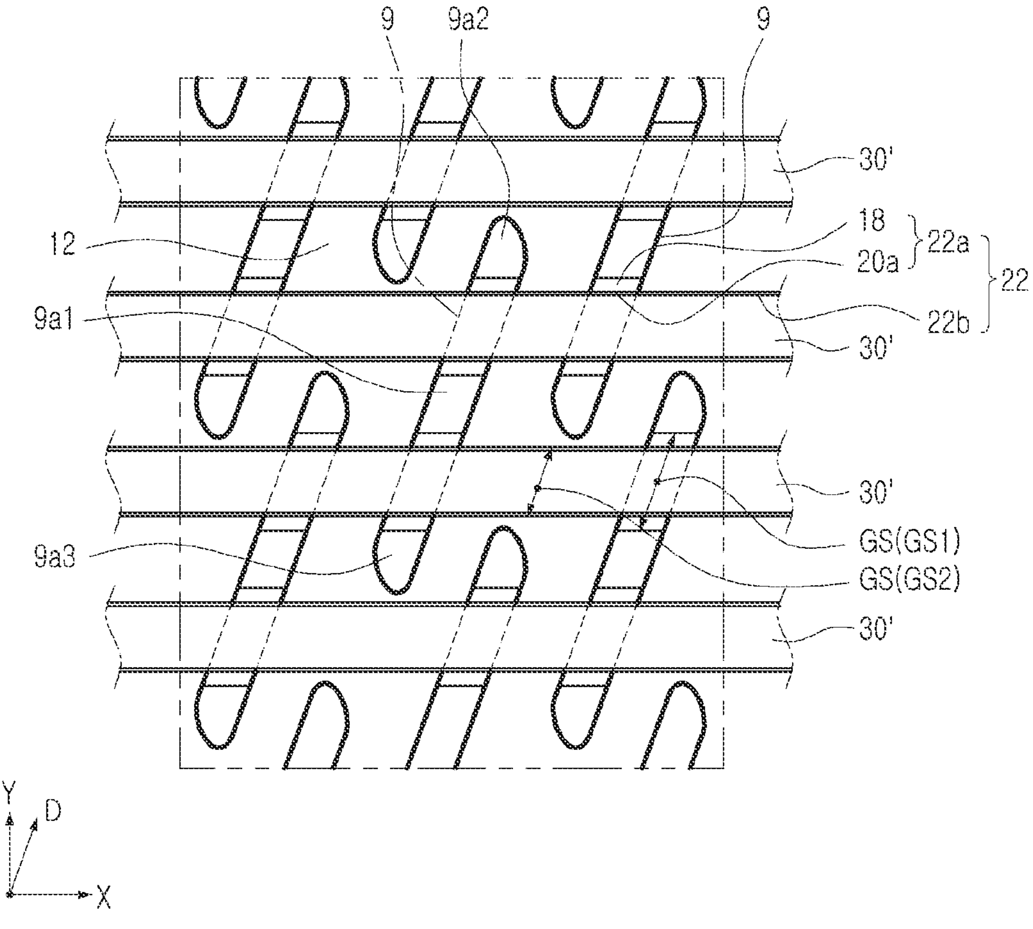
FIG. 4B is a plan view conceptually illustrating a modified example of some elements of a semiconductor device according to an example embodiment.

Next, with reference to FIG. 4B, a modified example of the above-described gate electrode 30 will be described with reference to FIGS. 1, 2A, 2B, 3A, and 3B. FIG. 4B is a plan view schematically illustrating a modified example of the gate electrode 30 in the top view of FIG. 2B.

Referring to FIG. 4B, the gate electrode 30 may be transformed into a gate electrode 30' having substantially the same width as that of the first gate portion GS1 and the second gate portion GS2. For example, the width of the gate electrode 30' of the first gate portion GS1 in the first direction D may be substantially the same as the width of the gate electrode of the second gate portion GS2 the first direction D.

In another example, when the modified embodiment of FIG. 4A and the modified embodiment of FIG. 4B are combined to form a semiconductor device according to an example embodiment, at the height level of the first gate portion GS1 having the maximum width Wa, the difference between the width of the gate electrode (30' of FIG. 4B) of the first gate portion GS1 and the width of the gate electrode (30' of FIG. 4B) of the second gate portion GS2 may be less than the difference between the width of the insulating capping pattern (33' in FIG. 4A) of the first gate portion GS1 and the width of the insulating capping pattern (33' in FIG. 4A) of the second gate portion GS2 in the first direction D.

Figure 5:
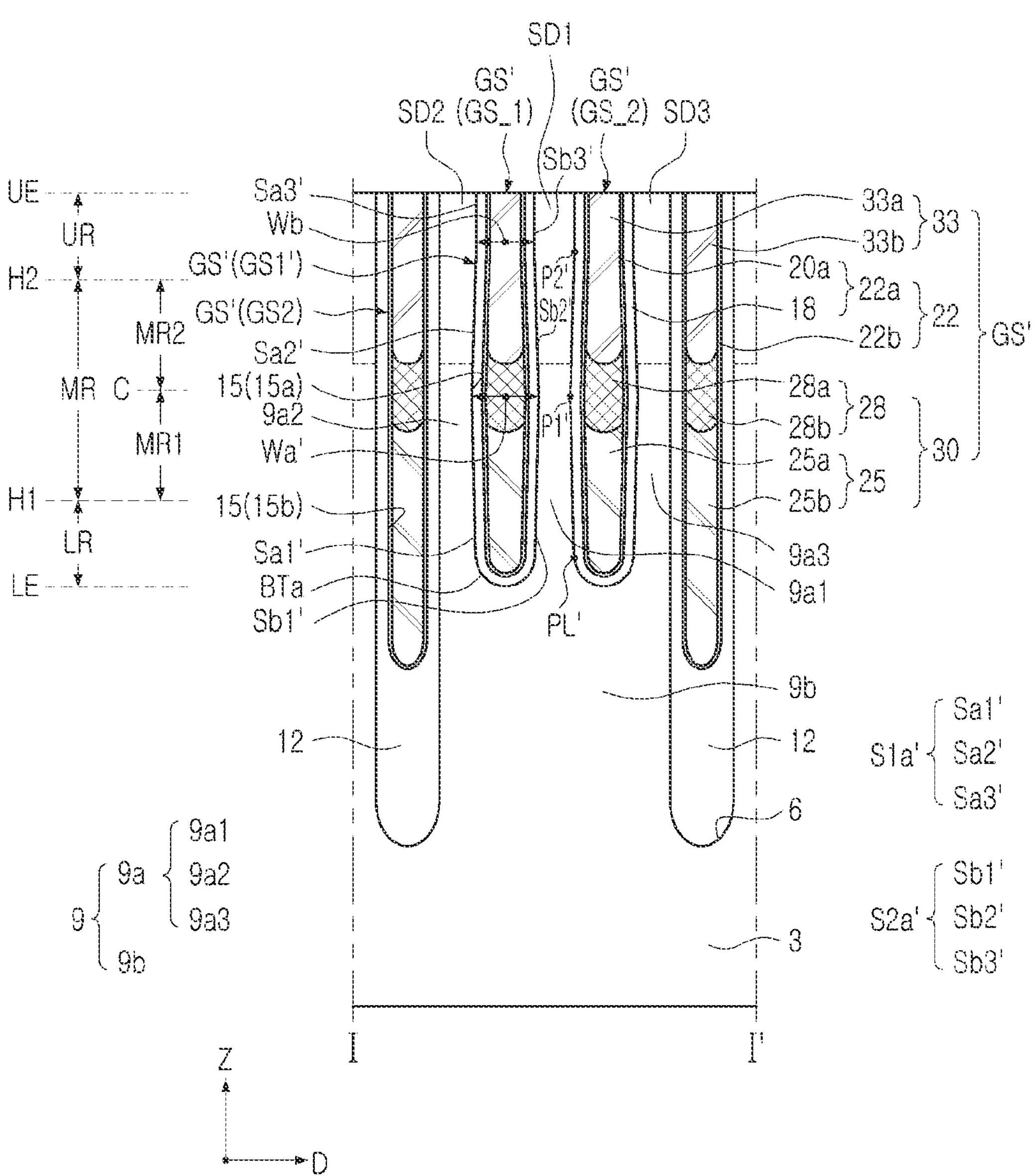
FIG. 5 is a cross-sectional view conceptually illustrating a modified example of some elements of a semiconductor device according to an example embodiment.

Next, with reference to FIG. 5, a modification example of the cross-sectional structure in the first direction D of the first gate portion GS1 described above with reference to FIGS. 1, 2A, 2B, 3A, and 3B will be described. FIG. 5 is a cross-sectional view taken along the line I-I' in FIG. 1 to describe a modified example of a cross-sectional structure of the first gate portion GS1 in the first direction D.

Referring to FIG. 5, the gate structure GS described above with reference to FIGS. 1, 2A, 2B, 3A, and 3B may be transformed into a gate structure GS' as illustrated in FIG. 5. For example, the first gate portion (GS1 in FIG. 3A) of the gate structure GS described above with reference to FIGS. 1, 2A, 2B, 3A, and 3B may be transformed into the first gate portion GS1' of the gate structure GS' as illustrated in FIG. 5.

The first gate portion GS1' of the gate structure GS' may include the lower region LR, the intermediate region MR, and the upper region UR as illustrated in FIG. 3A. In the first direction D, the first gate portion GS1' may have a maximum width Wa' within the intermediate region MR, where the second conductive pattern 28 of the intermediate region MR is located. For example, in the first gate portion GS1', the portion having the maximum width Wa' may be located on the level between the upper surface of the second conductive pattern 28 and the lower surface of the second conductive pattern 28.

The first gate portion GS1' may have the curved bottom surface (BTa) curved downward, and a first side surface S1*a'* and a second side surface S2*a'* extending from the bottom surface BTa and facing each other in the first direction D.

The first side surface (S1*a'*) may include a first lower portion (Sa1'), a first middle portion Sa2' on the first lower portion Sa1', and a first upper portion Sa3' on the first middle portion Sa2'. The second side surface (S2*a'*) may include a second lower portion (Sb1'), a second middle portion (Sb2') on the second lower portion (Sb1'), and a second upper portion (Sb3') on the second middle portion (Sb2'). In the first and second side surfaces S1*a'* and S2*a'*, the first lower portion Sa1' and the second lower portion Sb1' may face each other, the first middle portion (Sa2') and the second middle portion Sb2' may face each other, and the first upper portion Sa3' and the second upper portion Sb3' may face each other. In the first and second side surfaces S1*a'* and S2*a'*, the first lower portion Sa1' and the second lower portion Sb1' may be inclined so that the width of the first gate portion GS1' increases in the vertical direction Z, and the first middle portion Sa2' and the second middle portion Sb2' may be inclined so that the width of the first gate portion GS1' decreases in the vertical direction Z. In the first and second side surfaces S1*a'* and S2*a'*, the first upper portion Sa3' and the second upper portion Sb3' may have a substantially parallel shape. The first lower portion Sa1' and the first middle portion Sa2' may have different slopes. The second lower portion Sb1' and the second middle portion Sb2' may have different slopes. The first middle portion Sa2' and the first upper portion Sa3' may have different slopes. The second middle portion Sb2' and the second upper portion Sb3' may have different slopes. The second lower portion Sb1' may have a positive slope, and the second middle portion Sb2' may have a negative slope.

A side surface of the first gate portion GS1' may include a lower portion PL', a first portion P1', and a second portion P2'. In the first gate portion GS1', the lower portion PL' may be a portion between the bottom surface BTa and the first lower portion Sa1' and between the bottom surface BTa and the second lower portion Sb1', the first portion (P1') may be a part between the first lower portion (Sa1') and the first middle portion (Sa2') and between the second lower portion (Sb1') and the second middle portion (Sb2'), and the second portion (P2') may be a portion between the first upper portion Sa3' and the first middle portion Sa2' and between the second upper portion Sb3' and the second middle portion Sb2'.

In the first gate portion GS1', a width at a portion where the first portion P1' is positioned may be greater than a width at a portion where the lower portion PL' is positioned, and may be greater than the width of the part where the second portion P2' is located.

In the first gate portion GS1', a width at a portion where the first portion P1' is positioned may be the maximum width Wa' of the first gate portion GS1'.

In the first gate portion GS1', the lower portion PL' may be disposed on a level lower than the first height H1.

In the first gate portion GS1', the first portion P1' may be disposed on a level between the upper and lower surfaces of the second conductive pattern 28.

In the first gate portion GS1', the second portion P2' may be disposed on a level higher than the lower surface of the second conductive pattern 28.

Figure 6A:
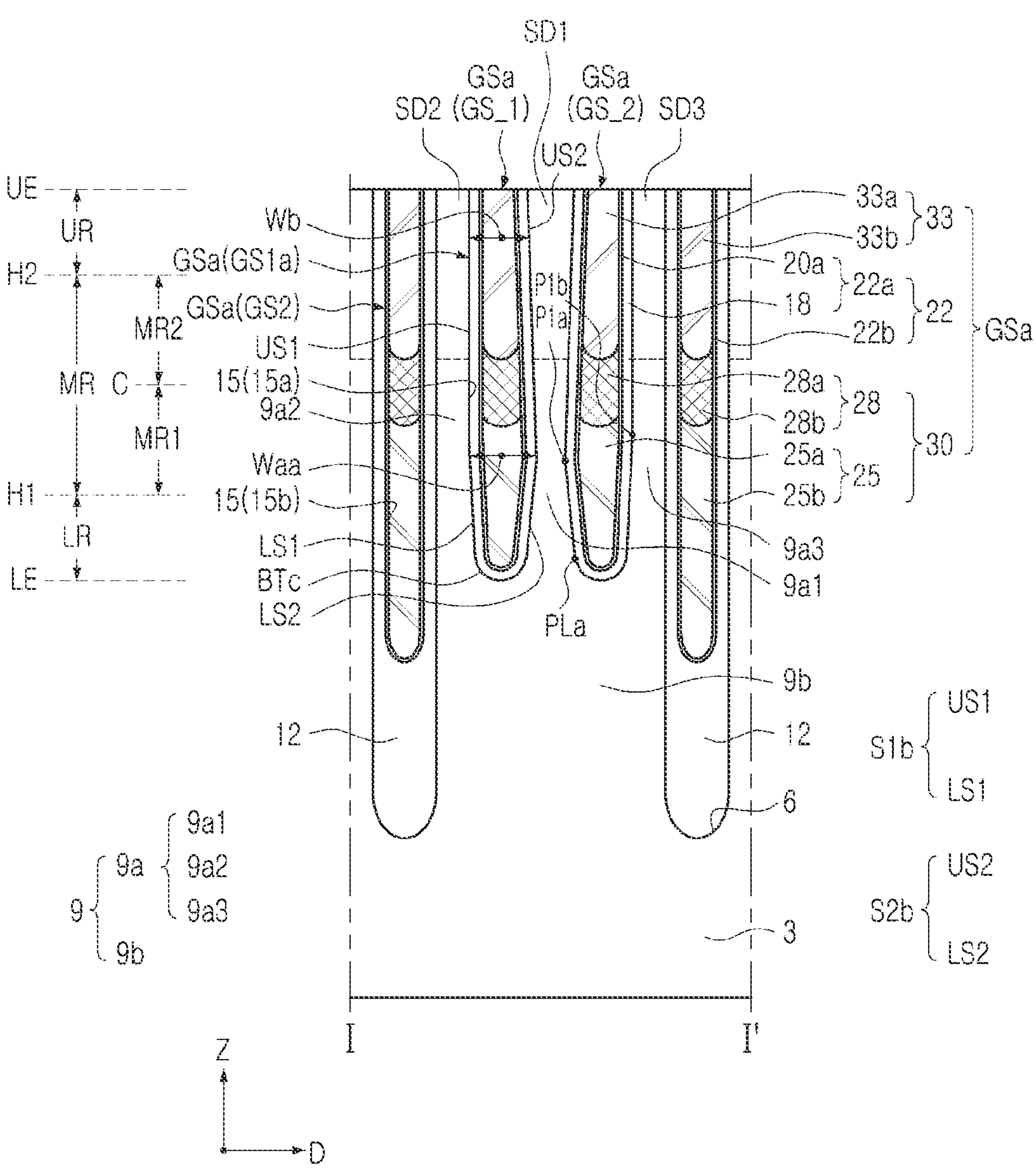
FIG. 6A is a cross-sectional view conceptually illustrating a modified example of some elements of a semiconductor device according to an example embodiment.

Next, with reference to FIG. 6A, a modified example of the cross-sectional structure of the first gate portion GS1 described above in the first direction D with reference to FIGS. 1, 2A, 2B, 3A and 3B will be described. FIG. 6A is a cross-sectional view taken along line I-I' in FIG. 1 to illustrate a modified example of a cross-sectional structure of the first gate portion GS1 described above with reference to FIGS. 1, 2A, 2B, 3A, and 3B in the first direction D.

Referring to FIG. 6A, the gate structure GS described above with reference to FIGS. 1, 2A, 2B, 3A and 3B may be transformed into the same gate structure GSa, as in FIG. 6A. For example, the first gate portion (GS1 in FIG. 3A) of the gate structure GS may be transformed into the first gate portion GS1*a* of the gate structure GSa as illustrated in FIG. 6A.

The first gate portion GS1*a* of the gate structure GSa may include the lower region LR, the intermediate region MR, and the upper region UR as illustrated in FIG. 6A.

In the first direction D, the maximum width Waa of the intermediate region MR may be greater than the width Wb of the upper region UR. In the first gate portion GS1*a*, the maximum width Waa in the intermediate region MR may be the maximum width of the first gate portion GS1*a*.

The first gate portion GS1*a* may have a maximum width Waa in the intermediate region MR, where the first conductive pattern 25 of the intermediate region MR is located.

The first gate portion GS1*a* may have the curved bottom surface (BTc) curved downward, and a first side surface S1*b* and a second side surface S2*b* extending from the bottom surface BTc and facing each other in the first direction D. The first side surface (S1*b*) may include a first lower portion LS1 extending from the bottom surface BTc, and a first upper portion US1 having a slope different from that of the first lower portion LS1 on the first lower portion LS1. The second side surface (S2*b*) may include a second lower portion LS2 extending from the bottom surface BTc, and a second upper portion US2 having a slope different from that of the second lower portion LS2 on the second lower portion LS2.

In the first and second side surfaces S1*b* and S2*b*, the first lower portion LS1 and the second lower portion LS2 may be inclined so that the width of the first gate portion GS1*a* increases in the vertical direction Z. The first lower portion LS1 may have a steeper slope than the second lower portion LS2.

An upper end of the first lower portion LS1 may be disposed on a different level from an upper end of the second lower portion LS2. For example, an upper end of the first lower portion LS1 may be disposed at a higher level than an upper end of the second lower portion LS2.

An upper end of the first lower portion LS1 and an upper end of the second lower portion LS2 may be higher than the first height H1.

At least one of an upper end of the first lower portion LS1 and an upper end of the second lower portion LS2 may be disposed on a level lower than the upper surface of the first conductive pattern 25. For example, an upper end of the first lower portion LS1 and an upper end of the second lower portion LS2 may be disposed on a level lower than the upper surface of the first conductive pattern 25.

A side surface of the first gate portion GS1*a* may include a lower portion PLa, a first portion P1*a*, and a second portion P1*b*. In the first gate portion GS1*a*, the lower portion PLa may be a portion between the bottom surface BTc and the first lower portion LS1 and between the bottom surface BTc and the second lower portion LS2. The second portion P1*b* may be a portion between the first lower portion LS1 and the first upper portion US1, and the first portion P1*a* may be a portion between the second lower portion LS2 and the second upper portion US2.

The first portion P1*a* and the second portion P1*b* may be disposed on different levels. For example, the first portion P1*a* may be disposed on a level lower than the second portion P1*b*.

The first gate portion GS1*a* may have a smaller width at a portion where the second portion P1*b* is positioned than a width at a portion where the first portion P1*a* is positioned.

The first gate portion GS1*a* may have a maximum width Waa at a portion where the first portion P1*a* is located.

As described above, the gate structure GSa may include a first gate structure GS_1 and a second gate structure GS_2 crossing an active region 9, where the first gate structure GS_1 and the second gate structure GS_2 can form a pair. The first gate portion GS1*a* of the first gate structure GS_1 and the first gate portion GS1*a* of the second gate structure GS_2 may have a mirror symmetrical structure with respect to the first active portion 9*a*1.

The second side surface S2*b* of the first gate portion GS1*a* of the first gate structure GS_1 and the second side surface S2*b* of the first gate portion GS1*a* of the second gate structure GS_2 may face each other with the first active part 9*a*1 interposed therebetween.

The first side surface S1*b* of the first gate portion GS1*a* of the first gate structure GS_1 may contact the second active portion 9*a*2, and the first side surface S1*b* of the first gate portion GS1*a* of the second gate structure GS_2 may contact the third active portion 9*a*3.

Figure 6B:
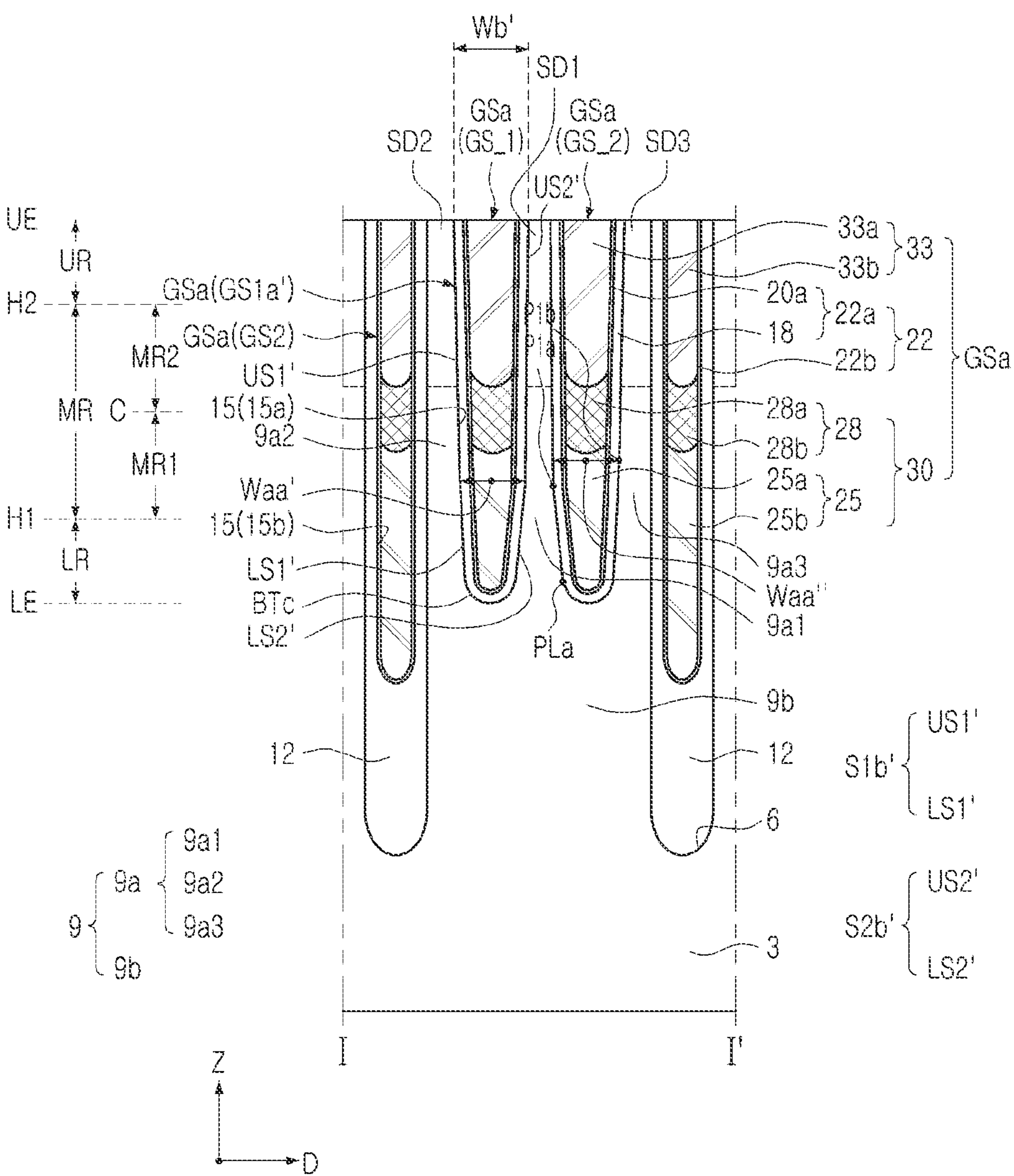
FIG. 6B is a cross-sectional view conceptually illustrating a modified example of some elements of a semiconductor device according to an example embodiment.

The maximum width Waa of the intermediate region MR may be the maximum width of the first gate portion GS1*a*, but the example embodiment is not limited thereto. For example, in the first gate portion GS1*a*, the maximum width of the upper region UR may be substantially equal to or greater than the maximum width Waa of the intermediate region MR. In this manner, a modified example of the first gate portion GS1*a* will be described with reference to FIG. 6B. FIG. 6B is a cross-sectional structure illustrating a change in width of the upper region US of the first gate portion GS1*a* in the cross-sectional structure of FIG. 6A, and in FIG. 6B, the description will be centered on the deformed portion of the first gate portion (GS1*a* in FIG. 6A).

In a modified example, referring to FIG. 6B, the first gate portion (GS1*a* in FIG. 6A) having the first and second side surfaces S1*b* and S2*b* described in FIG. 6A may be transformed into the first gate portion GS1*a*' having modified first and second side surfaces S1*b*' and S2*b*' as illustrated in FIG. 6B.

The first gate portion GS1*a*' may have the curved bottom surface (BTc) curved downward, and the first side surfaces S1*b*' and the second side surface (S2*b*') extending from the bottom surface BTc and facing each other in the first direction D. The first side surface (S1*b*') may include a first lower portion LS1' extending from the bottom surface BTc, and a first upper portion US1' having a different slope from that of the first lower portion LS1' on the first lower portion LS1'. The second side surface (S2*b*') may include a second lower portion LS2' extending from the bottom surface BTc, and a second upper portion US2' having a slope different from that of the second lower portion LS2' on the second lower portion LS2'.

In the first and second side surfaces S1*b*' and S2*b*', the first lower portion LS1' and the second lower portion LS2' may be inclined such that the width of the first gate portion GS1*a*' may be increased in the vertical direction Z. The first lower portion LS1' may have a slope, to be steeper than the second lower portion LS2'.

An upper end of the first lower portion LS1' may be disposed on a different level from an upper end of the second lower portion LS2'. For example, the upper end of the first lower portion LS1' may be disposed at a higher level than the upper end of the second lower portion LS2'.

An upper end of the first lower portion LS1' and an upper end of the second lower portion LS2' may be higher than the first height H1.

At least one of an upper end of the first lower portion LS1' and an upper end of the second lower portion LS2' may be disposed on a level lower than the upper surface of the gate electrode 30.

In an example, an upper end of the first lower portion LS1' and an upper end of the second lower portion LS2' may be disposed on a level lower than the upper surface of the first conductive pattern 25.

In another example, at least one of an upper end of the first lower portion LS1' and an upper end of the second lower portion LS2' may be disposed on a level higher than the upper surface of the first conductive pattern 25.

The side surface of the first gate portion GS1*a*' may have the lower portion PLa, the first portion P1*a*, and the second portion P1*b* substantially the same as those described in FIG. 6A. In the first gate portion GS1*a*', the lower portion PLa may be a portion formed between the bottom surface BTc and the first lower portion LS1', and between the bottom surface BTc and the second lower portion LS2', the second portion P1*b* may be a portion between the first lower portion LS1' and the first upper portion US1', and the first portion P1*a* may be a portion between the second lower portion LS2' and the second upper portion US2'.

The first portion P1*a* and the second portion P1*b* may be disposed on different levels. For example, the first portion P1*a* may be disposed on a level lower than the second portion P1*b*.

In an example, in the first gate portion GS1*a*, at least one of the width Waa' of the first portion P1*a* and the width Waa" of the second portion P1*b* may be substantially equal to the maximum width Wb' of the upper region UR of the first gate portion GS1*a*.

In another example, in the first gate portion GS1*a*, at least one of the width Waa' of the first portion P1*a* and the width Waa" of the second portion P1*b* may be smaller than the maximum width Wb' of the upper region UR of the first gate portion GS1*a*.

The maximum width Wb' of the upper region UR of the first gate portion GS1*a* may be the maximum width of the first gate portion GS1*a*.

The maximum width Wb' of the upper region UR of the first gate portion GS1*a* may be the width of the upper surface of the first gate portion GS1*a*, but the example embodiments are not limited thereto. For example, the maximum width Wb' of the upper region UR of the first gate portion GS1*a* may be the width of a region located on a level lower than the upper surface of the first gate portion GS1*a* and located on a level higher than the upper surface of the gate electrode 30.

Figure 7:
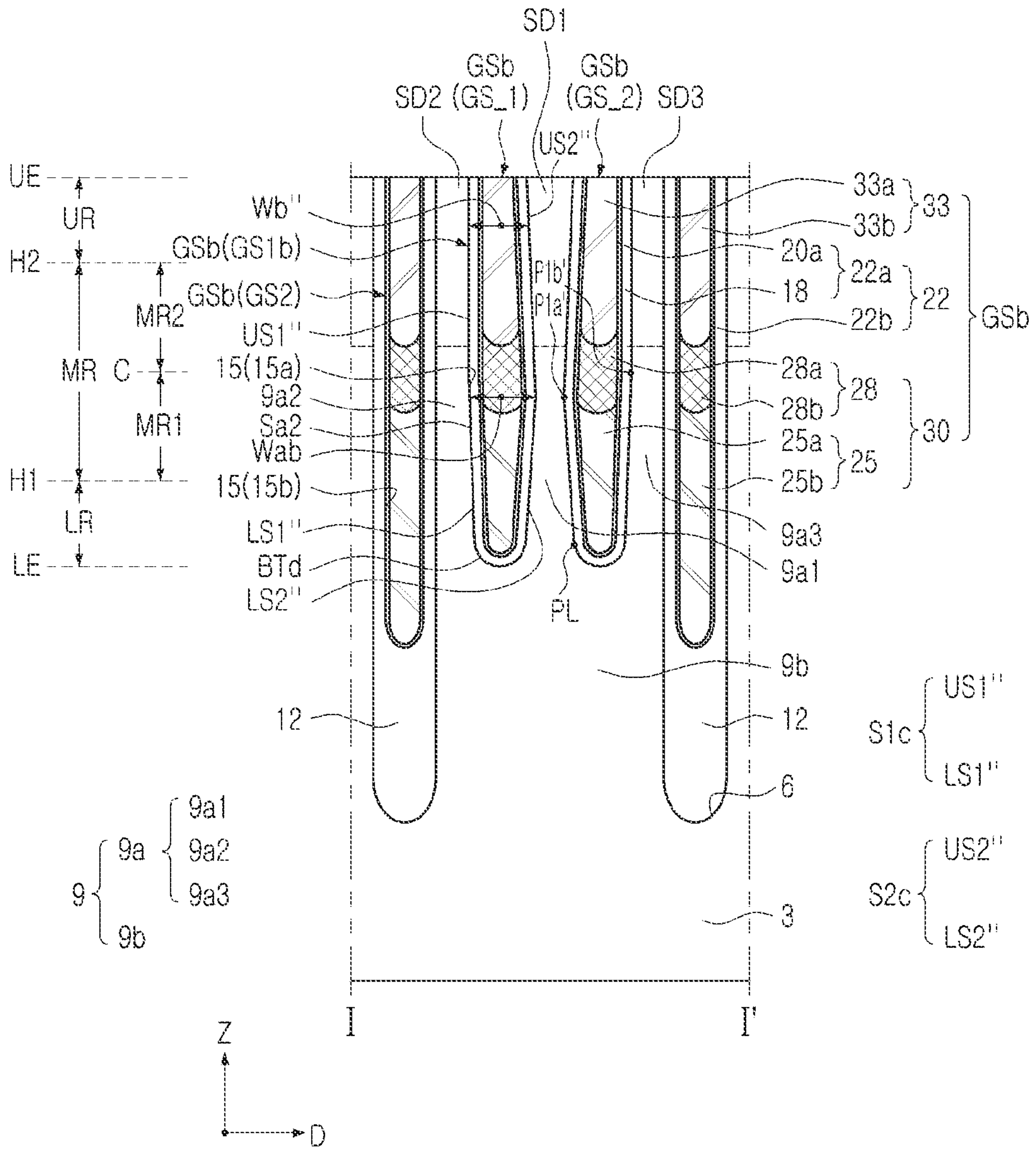
FIG. 7 is a cross-sectional view conceptually illustrating a modified example of some elements of a semiconductor device according to an example embodiment.

Next, with reference to FIG. 7, a modified example of the cross-sectional structure in the first direction D of the first gate portion GS1 described above with reference to FIGS. 1, 2A, 2B, 3A, and 3B will be described. FIG. 7 is a cross-sectional view taken along the line I-I' of FIG. 1 to illustrate a modified example of a cross-sectional structure of the first gate portion GS1 in the first direction D described above with reference to FIGS. 1, 2A, 2B, 3A, and 3B.

Referring to FIG. 7, the gate structure GS described above with reference to FIGS. 1, 2A, 2B, 3A and 3B may be transformed into a gate structure GSb as illustrated in FIG. 7. For example, the first gate portion (GS1 in FIG. 3A) of the gate structure GS described above with reference to FIGS. 1, 2A, 2B, 3A, and 3B may be modified to the first gate portion GS1*b* of the gate structure GSb as illustrated in FIG. 7.

The first gate portion GS1*b* of the gate structure GSb may include the lower region LR, the intermediate region MR, and the upper region UR as illustrated in FIG. 3A. In the first direction D, the first gate portion GS1*b* may have a maximum width Wab in the intermediate region MR where the second conductive pattern 28 of the intermediate region MR is located.

The first gate portion GS1*b* may have the curved bottom surface (BTd) curved downward, and a first side surface S1*c* and a second side surface S2*c* extending from the bottom surface BTd and facing each other in the first direction D. The first side surface (S1*c*) may include a first lower portion LS1" extending from the bottom surface BTd, and a first upper portion US1" having a different slope from that of the first lower portion LS1" on the first lower portion LS1". The second side surface (S2*c*) may include a second lower portion LS2" extending from the bottom surface BTd, and a second upper portion US2" having a different slope from the second lower portion LS2" on the second lower portion LS2".

In the first and second side surfaces S1*c* and S2*c*, the first lower portion LS1" and the second lower portion LS2" may be inclined so that the width of the first gate portion GS1*b* increases in the vertical direction Z. The first lower portion LS1" may have a steeper slope than the second lower portion LS2".

An upper end of the first lower portion LS1" may be disposed on a different level from an upper end of the second lower portion LS2". For example, the upper end of the first lower portion LS1" may be disposed at a higher level than the upper end of the second lower portion LS2".

At least one of an upper end of the first lower portion LS1" and an upper end of the second lower portion LS2" may be disposed on a level higher than the upper surface of the first conductive pattern 25. For example, an upper end of the first lower portion LS1" and an upper end of the second lower portion LS2" may be disposed on a level higher than the upper surface of the first conductive pattern 25.

At least one of an upper end of the first lower portion LS1" and an upper end of the second lower portion LS2" may be disposed on a level lower than the upper surface of the second conductive pattern 28.

The first gate portion GS1*b* may include a lower portion PL, a first portion P1*a*', and a second portion P1*b*'. In the first gate portion GS1*b*, the lower portion PL is disposed between the bottom surface BTd and the first lower portion LS1", and between the bottom surface BTd and the second lower portion LS2", the second portion P1*b*' may be a portion between the first lower portion LS1" and the first upper portion US1", and the first portion (P1*a*') may be a portion between the second lower portion LS2" and the second upper portion US2".

At least one of the first portion P1*a*' and the second portion P1*b*' may be disposed on a level higher than the upper surface of the first conductive pattern 25. The first portion P1*a*' and the second portion P1*b*' may be disposed on different levels. For example, the first portion P1*a*' may be disposed on a level lower than the second portion P1*b*'.

The first gate portion GS1*b* may have a smaller width at a portion where the second portion P1*b*' is positioned than a width at a portion where the first portion P1*a*' is positioned.

In an example, the first gate portion GS1*b* may have a maximum width Wab at a portion where the first portion P1*a*' is located.

In another example, a maximum width Wab of a portion of the first gate portion GS1*b* where the first portion P1*a*' is positioned may be substantially equal to a maximum width of the upper region UR.

In another example, a maximum width Wab of a portion of the first gate portion GS1*b* where the first portion P1*a*' is located may be smaller than a maximum width Wb" of the upper region UR.

Figure 8:
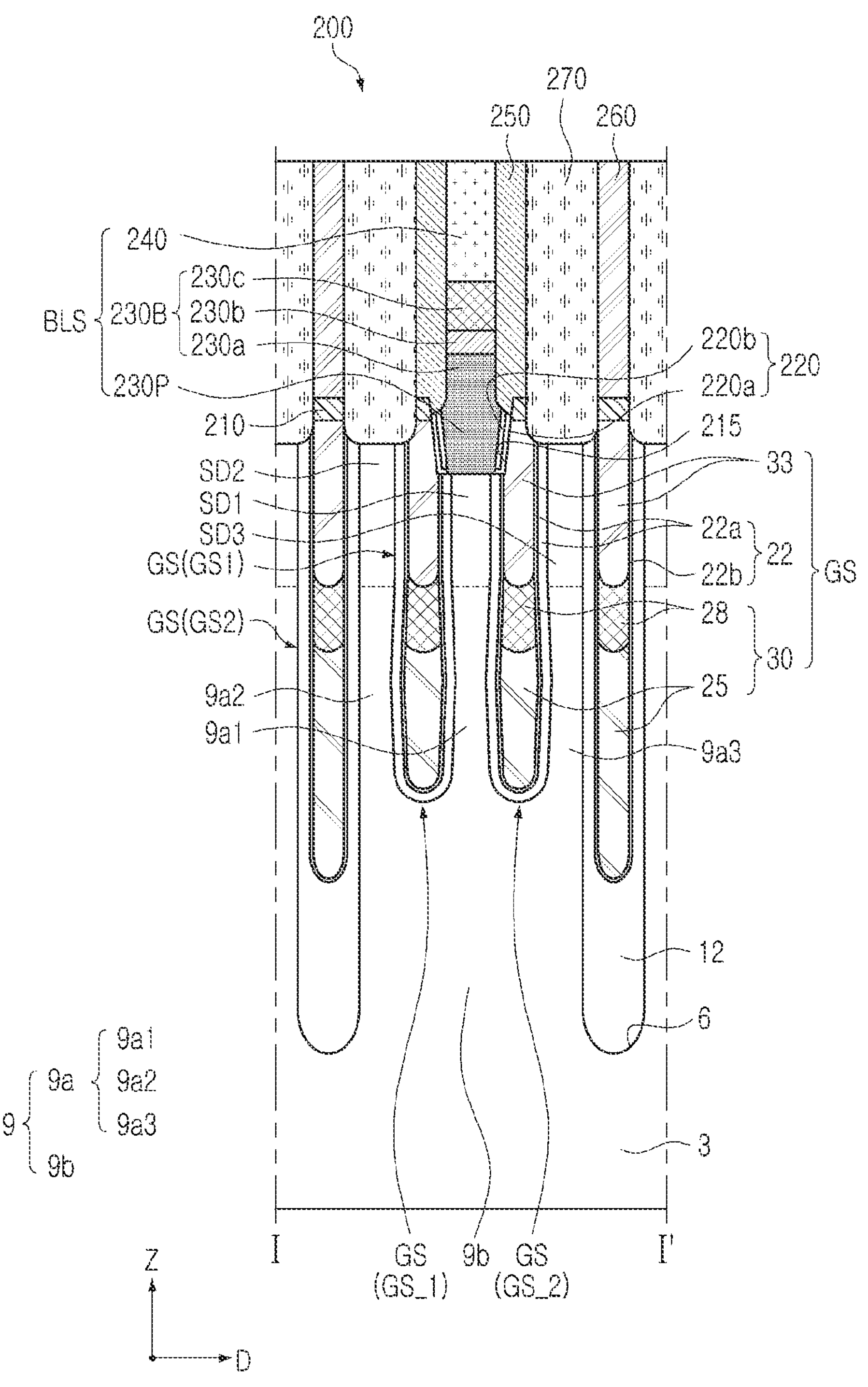
FIG. 8 is a cross-sectional view conceptually illustrating a modified example of a semiconductor device according to an example embodiment.
Figure 9:
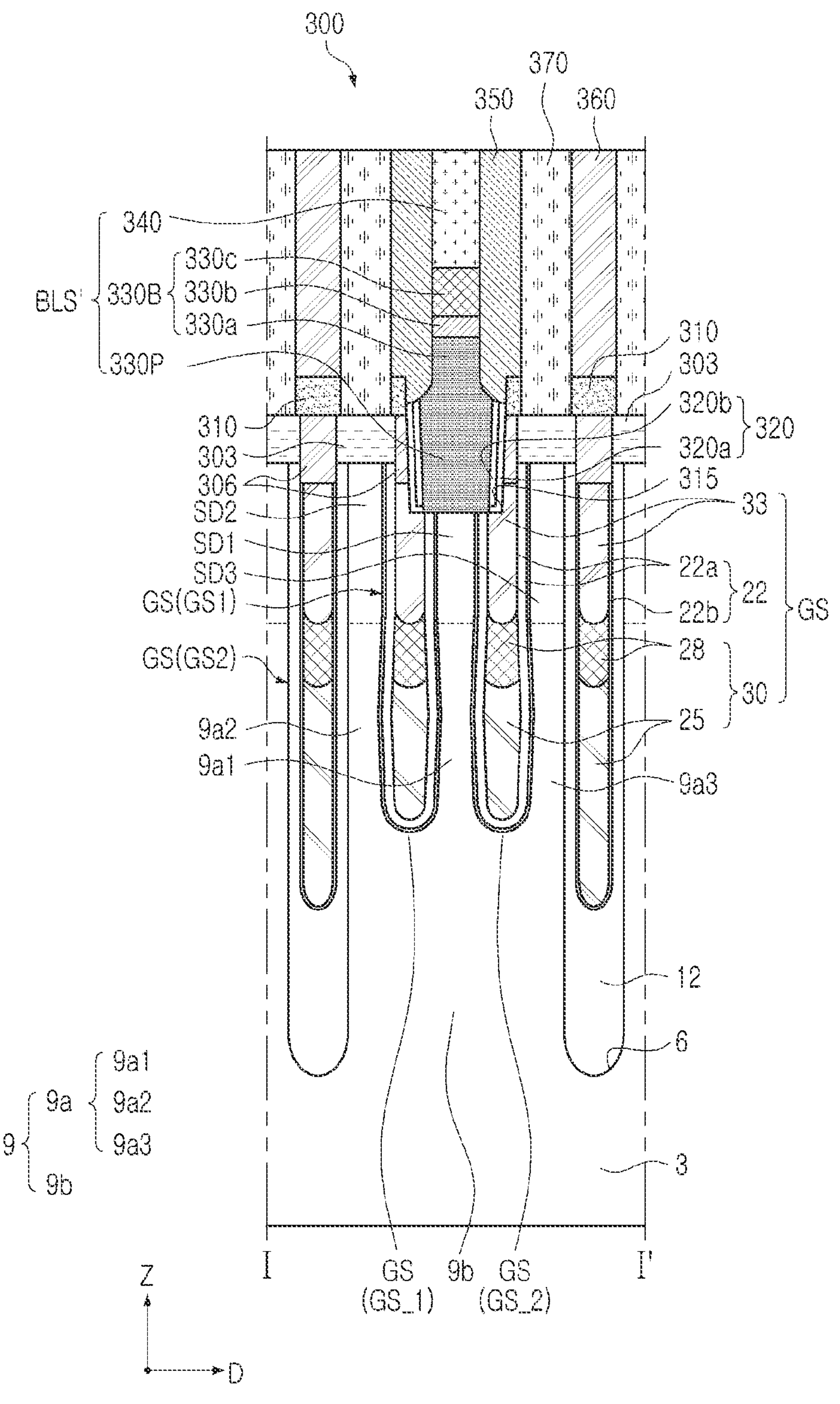
FIG. 9 is a cross-sectional view conceptually illustrating a modified example of a semiconductor device according to an example embodiment.

Next, referring to FIGS. 8 and 9, respectively, various examples of a semiconductor device including an example among the example embodiments described with reference to FIGS. 1, 2A, 2B, 3A, and 3B, and modified embodiments described with reference to FIGS. 4A, 4B, 5, 6A, 6B, and 7, respectively, will be described. FIG. 8 is a cross-sectional view of a region taken along line I-I' of FIG. 1 to describe an example of a semiconductor device including the example embodiment described with reference to FIGS. 1, 2A, and 2B, and FIG. 9 is a cross-sectional view of a region taken along line I-I' of FIG. 1 to describe another example of a semiconductor device including the example embodiment described with reference to FIGS. 1, 2A, and 2B.

In an example, with reference to FIG. 8, in conjunction with the example embodiment described with reference to FIGS. 1, 2A, 2B, 3A, and 3B, a semiconductor device 200 may include an insulating buffer pattern 210, a contact hole 215 penetrating the insulating buffer pattern 210 and extending downward, a spacer structure 220 on a side surface of the contact hole 215, and a wiring structure BLS.

Although the insulating buffer pattern 210 may be disposed on the structure according to the example embodiment described with reference to FIGS. 1, 2A, 2B, 3A, and 3B, but the examples are not limited thereto. For example, the insulating buffer pattern 210 may be disposed on the structure according to any one of the modified embodiments described with reference to FIGS. 4A, 4B, 5, 6A, 6B, and 7, respectively. The insulating buffer pattern 210 may include at least one insulating layer. For example, the insulating buffer pattern 210 may include at least one of a silicon nitride layer and a silicon oxide layer.

The contact hole 215 may pass through the insulating buffer pattern 210 and extend into the first impurity region SD1 to lower an upper surface of the first impurity region SD1. Accordingly, an upper surface of the first impurity region SD1 may be lower than upper surfaces of the second and third impurity regions SD2 and SD3.

The spacer structure 220 may be formed of an insulating material. The spacer structure 220 may include a first spacer layer 220*a* and a second spacer layer 220*b*. The first and second spacer layers 220*a* and 220*b* may include different insulating materials. The first spacer layer 220*a* may cover the sidewall of the contact hole 215 and may be disposed between the second spacer layer 220*b* and the sidewall of the contact hole 215.

The wiring structure BLS may be disposed in the contact hole 215, and may include a plug portion 230P electrically connected to the first impurity region SD1, a conductive line 230B connected to the plug portion 230P and disposed on a level higher than the insulating buffer pattern 210, and an upper insulating capping pattern 240 on the conductive line 230B. The spacer structure 220 may be disposed between the plug portion 230P and the sidewall of the contact hole 215.

The conductive line 230B may have a line shape extending in a third direction (Y in FIG. 1) perpendicular to the second direction (X in FIG. 1). The conductive line 230B may be a bit line of a memory such as a DRAM. The gate electrode 30 may be a word line of a memory such as DRAM.

The conductive line 230B may include at least one conductive layer. For example, the conductive line 230B may be doped silicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, graphene, carbon nanotube, or combinations thereof, but is not limited thereto. For example, the conductive line 230B may include a first conductive layer 230*a*, a second conductive layer 230*b* on the first conductive layer 230*a*, and a third conductive layer 230*c* on the second conductive layer 230*b*. The first to third conductive layers 230*a*, 230*b*, and 230*c* may be formed of different materials from each other. The plug portion 230P and the first conductive layer 230*a* may include the same material as each other, for example, doped silicon. The upper insulating capping pattern 240 may include an insulating material such as silicon nitride.

The semiconductor device 200 may further include an insulating spacer 250, an insulating fence 260 and contact structures 270. The insulating fence 260 may be disposed on the insulating buffer pattern 210. The contact structures 270 may pass through the insulating fence 260 and the insulating buffer pattern 210 and be electrically connected to the second and third impurity regions SD2 and SD3. Each of the contact structures 270 may be formed of doped Silicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, graphene, carbon nanotube, or combinations thereof, but is not limited thereto. The insulating spacer 250 may be disposed on side surfaces of the conductive line 230B and the upper insulating capping pattern 240. The insulating spacer 250 may be disposed between the wiring structure BLS and the contact structures 270.

In another example, referring to FIG. 9 in conjunction with the example embodiment described with reference to FIGS. 1, 2A, 2B, 3A and 3B, the semiconductor device 300 may include the pad patterns 303, the insulating separation pattern 306, the insulating buffer pattern 310, the contact hole 315, the spacer structure 320, and the wiring structure BLS'.

The pad patterns 303 and the insulating separation pattern 306 may be disposed on the structure according to the example embodiment described with reference to FIGS. 1, 2A, 2B, 3A, and 3B, but examples are not limited thereto. For example, the pad patterns 303 and the insulating separation pattern 306 may be disposed on a structure according to any one of the modified embodiments described with reference to FIGS. 4A, 4B, 5, 6A, 6B, and 7, respectively. The insulating buffer pattern 310 may include at least one insulating layer. For example, the insulating buffer pattern 310 may include at least one of a silicon nitride layer and a silicon oxide layer.

The insulating separation pattern 306 may pass through the pad patterns 303 and extend downward. An upper surface of the insulating separation pattern 306 may be coplanar with upper surfaces of the pad patterns 303. The lower surface of the insulating separation pattern 306 may be disposed on a level lower than the lower surfaces of the pad patterns 303.

The pad patterns 303 may be electrically connected to the second and third impurity regions SD2 and SD3. Each of the pad patterns 303 may include at least one conductive layer. Each of the pad patterns 303 may include doped silicon, metal, conductive metal nitride, metal-semiconductor compound, conductive metal oxide, graphene, carbon nanotube, or combinations thereof. For example, each of the pad patterns 303 is formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, graphene, carbon nanotube, or combinations thereof, but is not limited thereto. Each of the pad patterns 303 may include a single layer or multiple layers of the aforementioned materials.

The insulating buffer pattern 310 may be disposed on the pad patterns 303 and the insulating separation pattern 306. The insulating buffer pattern 310 may include the same material as the insulating buffer pattern 210 in FIG. 8.

The contact hole 315 may pass through the insulating buffer pattern 310 and the insulating separation pattern 306 and extend into the first impurity region SD1 to lower an upper surface of the first impurity region SD1. Accordingly, an upper surface of the first impurity region SD1 may be lower than upper surfaces of the second and third impurity regions SD2 and SD3.

The spacer structure 320 may be formed of an insulating material. The spacer structure 320 may include a first spacer layer 320*a* and a second spacer layer 320*b*. The first and second spacer layers 320*a* and 320*b* may include different insulating materials. The first spacer layer 320*a* may cover the sidewall of the contact hole 315 and may be disposed between the second spacer layer 320*b* and the sidewall of the contact hole 315.

The wiring structure BLS' is disposed in the contact hole 315 and may include a plug portion 330P electrically connected to the first impurity region SD1. A conductive line 330B disposed on a level higher than the insulating buffer pattern 310 and an upper insulating capping pattern 340 on the conductive line 330B may be included. The spacer structure 320 may be disposed between the plug portion 330P and the sidewall of the contact hole 315.

The conductive line 330B may have a line shape extending in a third direction (Y in FIG. 1) perpendicular to the second direction (X in FIG. 1). The conductive line 330B may be a bit line of a memory such as DRAM, and the gate electrode 30 may be a word line of a memory such as DRAM.

The conductive line 330B may include the same material as the material of the conductive line 230B described in FIG. 8. For example, the conductive line 330B may include a first conductive layer 330*a*, a second conductive layer 330*b* on the first conductive layer 330*a*, and a third conductive layer 330*c* on the second conductive layer 330*b*. The first to third conductive layers 330*a*, 330*b*, and 330*c* may include the same material as the first to third conductive layers 230*a*, 230*b*, and 230*c* described in FIG. 8. The upper insulating capping pattern 340 may include an insulating material such as silicon nitride.

The semiconductor device 300 may further include an insulating spacer 350, an insulating fence 360 and contact structures 370. The insulating fence 360 may be disposed on the insulating buffer pattern 310. The contact structures 370 may pass through the insulating fence 360 and the insulating buffer pattern 310 and be electrically connected to the pad patterns 303. The contact structures 370 may include the same material as the contact structures 270 described in FIG. 8. The insulating spacer 350 may be disposed on side surfaces of the conductive line 330B and the upper insulating capping pattern 340. The insulating spacer 350 may be disposed between the wiring structure BLS' and the contact structures 370.

Figure 10:
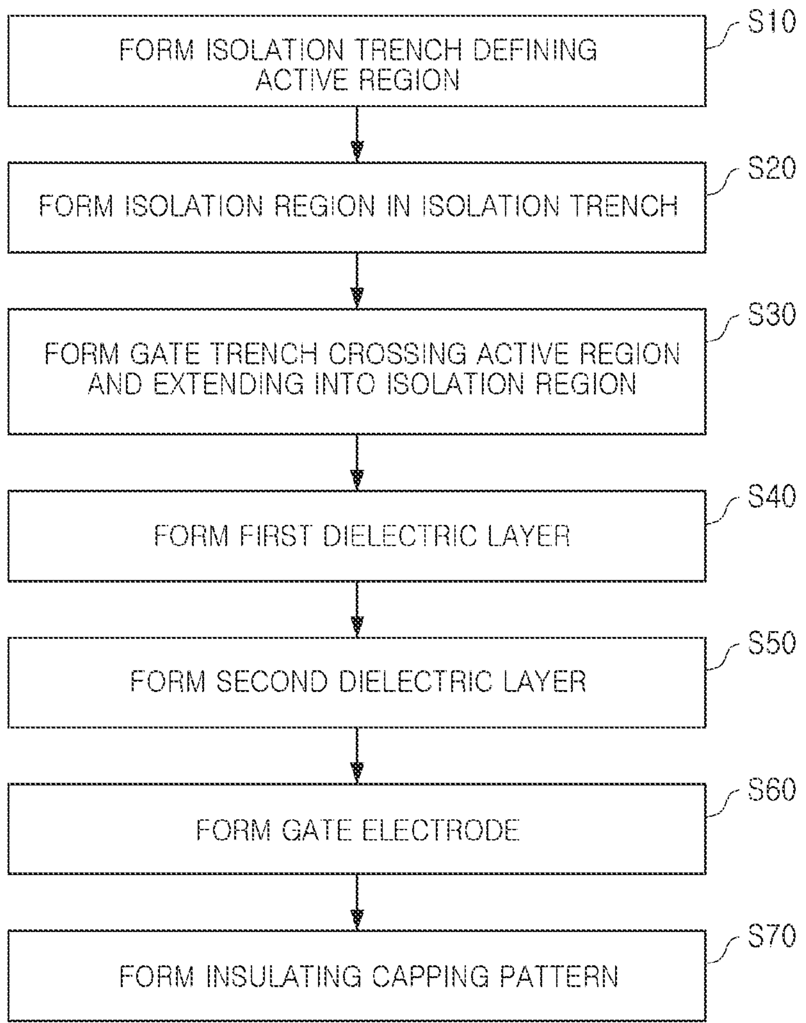
FIG. 10 provides diagrams schematically illustrating an illustrative example of a method of forming a semiconductor device according to an example embodiment.

Next, referring to FIG. 10, an illustrative example of a method of forming a semiconductor device according to an example embodiment will be described. FIG. 10 is a process flow chart illustrating a method of forming a semiconductor device according to embodiments.

Referring to FIG. 10 together with FIGS. 1, 2A, 2B, 3A, and 3B, a device isolation trench 6 defining the active region 9 may be formed (S10). The device isolation trench 6 may be formed by a shallow trench device isolation process. The active region 9 may be formed to protrude from the semiconductor substrate 3 by the device isolation trench 6. An isolation region 12 may be formed in the device isolation trench 6 (S20). The isolation region 12 may define a side surface of the active region 9.

A gate trench 15 may be formed to cross the active region 9 and extend into the isolation region 12 (S30). A plurality of gate trenches 15 may be formed.

The first to third active portions 9*a*1, 9*a*2, and 9*a*3 as described above with reference to FIGS. 1, 2A, 2B, 3A, and 3B may be formed by the gate trenches 15.

The shape of the side and bottom surfaces of the gate structures GS described in the example embodiment of FIGS. 1, 2A, 2B, 3A and 3B, the shape of the side of the gate structure GS in FIG. 4A, or the shape of the side of the gate structure GS in FIG. 4B may be determined by the gate trenches 15, but the example embodiment is not limited thereto. For example, the gate trenches 15 may be deformed into various shapes. For example, the gate trenches 15 may be formed as the side and bottom shapes of the gate structure GS' in the example embodiment of FIG. 5, the side and bottom shapes of the gate structure GSa in the example embodiment of FIG. 6A or 6B, or side and bottom shapes of the gate structure GSb in the example embodiment of FIG. 7.

A first dielectric layer 18 may be formed (S40). The first dielectric layer 18 may be formed by thermally oxidizing the active region 9 exposed by the gate trenches 15. Second dielectric layer 20*a* and second dielectric portion 22*b* may be formed (S50). The second dielectric layer 20*a* and second dielectric portion 22*b* may be formed using an atomic layer deposition process and may cover inner walls of the gate trenches 15. The second dielectric layer 20*a* and second dielectric portion 22*b* may cover the first dielectric layer 18.

A gate electrode 30 may be formed (S60). Forming the gate electrode 30 is performed by forming a first conductive material layer filling the gate trenches 15 on the second dielectric layer 20*a* and second dielectric portion 22*b* and partially etching the first conductive material layer. A first conductive pattern 25 is formed, a second conductive material layer is formed on the first conductive pattern 25 and the second dielectric layer 20*a* and second dielectric portion 22*b*, and the second conductive material layer is partially etched. to form the second conductive pattern 28. Accordingly, the gate electrode 30 including the first and second conductive patterns 25 and 28 as illustrated in FIGS. 3A and 3B may be formed.

An insulating capping pattern 33 may be formed (S70). Forming the insulating capping pattern 33 may include forming an insulating material filling the remaining spaces of the gate trenches 15 on the second dielectric layer 20*a* and second dielectric portion 22*b* and the second conductive pattern 28.

Accordingly, the gate structure GS including the dielectric layer 22, the gate electrode 30, and the insulating capping pattern 33 as described in FIGS. 1, 2A, 2B, 3A, and 3B may formed.

As described above, in the process of forming the gate trenches 15, the gate trenches 15 may be formed to have shapes, such as the side shape of the gate structure GS in FIG. 4A, the side shape of the gate structure GS in FIG. 4B, the side and bottom shapes of the gate structure GS' in the embodiment of FIG. 5, the side and bottom shapes of the gate structure GSa in the embodiment of FIG. 6A or 6B, or side and bottom shapes of the gate structure GSb in the embodiment of FIG. 7. Therefore, the gate structure GS as shown in FIG. 4A, the gate structure GS as shown in FIG. 4B, the gate structure GS' in the embodiment of FIG. 5, the gate structure GSa in the embodiment of FIG. 6A or 6B, or the gate structure GSb in the embodiment of FIG. 7 may be formed.

As set forth above, according to example embodiments, a semiconductor device including a gate structure that has a maximum width in an intermediate region may be provided. Accordingly, since resistance characteristics of the gate electrode of the gate structure may be improved, electrical characteristics of the semiconductor device may be improved and performance of the semiconductor device may be improved.

While example embodiments have been illustrated and described above, it will be apparent to those skilled in the art that modifications and variations could be made without departing from the scope of the present inventive concept as defined by the appended claims.

What is claimed is:

1. A semiconductor device comprising:

a semiconductor substrate;

an active region on the semiconductor substrate;

an isolation region on the semiconductor substrate, wherein the isolation region is on a side surface of the active region;

a first trench portion crossing the active region;

a second trench portion disposed in the isolation region;

a first gate portion within the first trench portion; and a second gate portion within the second trench portion, wherein the first gate portion includes:

a first gate dielectric layer on an inner wall of the first trench portion;

a first gate electrode on the first gate dielectric layer, wherein the first gate electrode partially fills the first trench portion, and has an upper surface at a level lower than an upper surface of the active region; and a first insulating capping pattern on the first gate electrode, wherein the second gate portion includes:

a second gate dielectric layer on an inner wall of the second trench portion;

a second gate electrode on the second gate dielectric layer, wherein the second gate electrode partially fills the second trench portion, and has an upper surface at a level lower than an upper surface of the active region; and a second insulating capping pattern on the second gate electrode, wherein the first gate portion includes a first lower region, a first intermediate region on the first lower region, and a first upper region on the first intermediate region, wherein in a first direction, a maximum width of the first intermediate region is greater than a maximum width of the first lower region, and wherein in the first direction, the maximum width of the first intermediate region is greater than a maximum width of the first upper region.

2. The semiconductor device of claim 1, wherein the first gate electrode includes:

a lower region, an intermediate region on the lower region, and an upper region on the intermediate region, wherein a maximum width of the intermediate region of the first gate electrode is greater than a maximum width of the lower region of the first gate electrode, and wherein the maximum width of the intermediate region of the first gate electrode is greater than a maximum width of the upper region of the first gate electrode.

3. The semiconductor device of claim 1, wherein the second gate electrode includes:

a second lower region;

a second intermediate region on the second lower region, wherein the second intermediate region is at a same level as the first intermediate region; and a second upper region on the second intermediate region, wherein the second upper region is at the same level as the first upper region, and wherein the second lower region has a lower end disposed at a level lower than a lower end of the first lower region.

4. The semiconductor device of claim 3, wherein in the first direction, a maximum width of the second intermediate region is smaller than the maximum width of the first intermediate region.

5. The semiconductor device of claim 1, wherein the first gate electrode includes a first conductive pattern and a second conductive pattern on the first conductive pattern, and wherein a material of the first conductive pattern is different from a material of the second conductive pattern.

6. The semiconductor device of claim 5, wherein the first conductive pattern is positioned to include the maximum width of the first intermediate region.

7. The semiconductor device of claim 5, wherein the second conductive pattern is positioned to include the maximum width of the first intermediate region.

8. The semiconductor device of claim 1, wherein in the first direction, a width of the first insulating capping pattern of the first gate portion is different from a width of the second insulating capping pattern of the second gate portion.

9. The semiconductor device of claim 8, wherein in the first direction, a width of the first insulating capping pattern of the first gate portion is less than a width of the second insulating capping pattern of the second gate portion.

10. The semiconductor device of claim 1, wherein in the first direction, a width of the first gate electrode of the first gate portion is different from a width of the second gate electrode of the second gate portion.

11. The semiconductor device of claim 10, wherein in the first direction, a width of the first gate electrode of the first gate portion is greater than a width of the second gate electrode of the second gate portion.

12. The semiconductor device of claim 1, wherein the first lower region is between a lower end of the first gate portion and a first height, wherein the first intermediate region is between the first height and a second height, wherein the first upper region is between the second height and an upper end of the first gate portion, wherein based on the lower end of the first gate portion, when a height from the lower end to the upper end of the first gate portion is 100, the first height is about 20 and the second height is about 80, and a portion where the maximum width is located in the first intermediate region is located at a level lower than an upper surface of the first gate electrode.

13. A semiconductor device comprising:

a semiconductor substrate;

an active region on the semiconductor substrate;

an isolation region on a side surface of the active region and on the semiconductor substrate;

a first trench portion crossing the active region;

a second trench portion in the isolation region;

a first gate portion within the first trench portion; and a second gate portion within the second trench portion, wherein the first gate portion includes:

a first gate dielectric layer on an inner wall of the first trench portion;

a first gate electrode on the first gate dielectric layer, wherein the first gate electrode partially fills the first trench portion; and a first insulating capping pattern on the first gate electrode, wherein the active region extends in a first direction, wherein the first gate portion has a first bottom surface curved downwardly, and a first side surface and a second side surface extending from the first bottom surface and opposing each other, wherein the first side surface includes a first lower portion, and a first upper portion on the first lower portion and having a slope different from a slope of the first lower portion, and wherein the second side surface includes a second lower portion, and a second upper portion on the second lower portion and having a slope different from a slope of the second lower portion.

14. The semiconductor device of claim 13, wherein in the first gate portion, a maximum width of the first gate electrode in the first direction is greater than a maximum width of the first insulating capping pattern in the first direction.

15. The semiconductor device of claim 13, wherein the first side surface and the second side surface have an asymmetric structure.

16. The semiconductor device of claim 13, wherein one of the second lower portion and the second upper portion has a positive slope and the other has a negative slope.

17. The semiconductor device of claim 13, wherein a width of the first insulating capping pattern in the first gate portion is different from a width of a second insulating capping pattern in the second gate portion.

18. A semiconductor device comprising:

a semiconductor substrate;

an active region on the semiconductor substrate;

an isolation region on a side surface of the active region and on the semiconductor substrate; and a first gate structure and a second gate structure extending into the isolation region and crossing the active region, wherein each of the first and second gate structures includes:

a gate electrode and an insulating capping pattern stacked sequentially; and a gate dielectric layer covering a lower surface of the gate electrode, a side surface of the gate electrode, and a side surface of the insulating capping pattern, wherein the active region extends in a first direction, wherein an upper surface of the gate electrode is disposed at a level lower than an upper end of the active region, wherein each of the first and second gate structures has a first gate portion crossing the active region and a second gate portion extending from the first gate portion and disposed in the isolation region, wherein a lower end of the second gate portion is disposed at a level lower than a lower end of the first gate portion, and wherein in the first gate portion, a maximum width of the gate electrode in the first direction is greater than a width of the insulating capping pattern adjacent to the gate electrode in the first direction.

19. The semiconductor device of claim 18, wherein in each of the first and second gate structures, the first gate portion has a bottom surface curved downwardly, and a first side surface and a second side surface extending from the bottom surface and opposing each other, and wherein at least one of the first side surface and the second side surface includes a lower portion and an upper portion having different slopes.

20. The semiconductor device of claim 18, wherein the gate electrode includes a first conductive pattern and a second conductive pattern on the first conductive pattern, wherein a portion of the gate electrode having the maximum width is disposed at a level higher than a middle between an upper surface and a lower surface of the first conductive pattern, and wherein the portion of the gate electrode having the maximum width is disposed at a level lower than an upper surface of the second conductive pattern.

* * * * *